United States Patent
Ge et al.

(10) Patent No.: US 10,187,087 B2
(45) Date of Patent: Jan. 22, 2019

(54) CONCATENATED AND SLIDING-WINDOW POLAR CODING

(71) Applicants: Yiqun Ge, Kanata (CA); Wuxian Shi, Kanata (CA)

(72) Inventors: Yiqun Ge, Kanata (CA); Wuxian Shi, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 21 days.

(21) Appl. No.: 15/003,184

(22) Filed: Jan. 21, 2016

(65) Prior Publication Data
US 2017/0214416 A1    Jul. 27, 2017

(51) Int. Cl.
| H03M 13/00 | (2006.01) |
| H03M 13/39 | (2006.01) |
| H03M 13/29 | (2006.01) |
| H03M 13/09 | (2006.01) |
| H03M 13/13 | (2006.01) |

(52) U.S. Cl.
CPC ....... *H03M 13/3972* (2013.01); *H03M 13/09* (2013.01); *H03M 13/13* (2013.01); *H03M 13/2927* (2013.01); *H03M 13/616* (2013.01)

(58) Field of Classification Search
CPC ......... H03M 13/3972; H03M 13/2927; H03M 13/616
See application file for complete search history.

(56) References Cited

U.S. PATENT DOCUMENTS

| 6,606,725 B1 * | 8/2003 | Wang ............... H03M 13/2957 |
| | | 714/755 |
| 7,191,096 B1 * | 3/2007 | Gross .................... G06F 11/008 |
| | | 702/179 |
| 7,383,484 B2 * | 6/2008 | Yeh ..................... G11B 20/1833 |
| | | 714/758 |

(Continued)

FOREIGN PATENT DOCUMENTS

| CN | 104219019 A | 12/2014 |
| CN | 105262494 A | 1/2016 |

OTHER PUBLICATIONS

Ido Tal et al., "List Decoding of Polar Codes", IEEE International Symposium on Information Theory Proceedings, 2011, pp. 1-5, San Diego, USA.

(Continued)

*Primary Examiner* — Esaw T Abraham

(57) ABSTRACT

Methods for encoding and decoding Polar codes are provided, together with apparatuses for performing the methods. An encoding method combines first and second sequences of information bits and CRC bits and a plurality of frozen bits into an input vector. The input vector is multiplied by a generator matrix for a Polar code to produce a concatenated codeword. A decoding method receives such a codeword and produces a decoded vector by generating successive levels of a decision tree. For a first number of levels of the decision tree, paths beyond a first maximum number of most probable paths are discarded. For a second number of levels of the decision tree, paths beyond a second maximum number of most probable paths are discarded. In some cases, the decoding method may have improved performance compared to some decoding methods for non-concatenated codewords.

19 Claims, 19 Drawing Sheets

(56) References Cited

U.S. PATENT DOCUMENTS

| | | | | |
|---|---|---|---|---|
| 7,656,337 | B2* | 2/2010 | Redmayne | H03M 1/0863 |
| | | | | 341/155 |
| 8,363,749 | B2* | 1/2013 | Lee | H04L 1/0625 |
| | | | | 375/295 |
| 8,451,929 | B2* | 5/2013 | Agee | H04B 7/0413 |
| | | | | 375/267 |
| 9,007,241 | B2* | 4/2015 | Alhussien | H03M 13/618 |
| | | | | 341/67 |
| 9,083,837 | B2* | 7/2015 | Tredoux | H04B 5/0031 |
| 9,209,832 | B2* | 12/2015 | Alhussien | H03M 13/618 |
| 9,319,070 | B2* | 4/2016 | Li | H03M 13/13 |
| 9,628,113 | B2* | 4/2017 | Jeong | H03M 13/2906 |
| 2014/0365842 | A1 | 12/2014 | Li et al. | |
| 2015/0222295 | A1 | 8/2015 | Li et al. | |
| 2016/0079999 | A1 | 3/2016 | Shen et al. | |

OTHER PUBLICATIONS

Erdal Arikan, "Channel polarization: A method for constructing capacity-achieving codes for symmetric binary-input memoryless channels", IEEE Transactions on Information Theory, vol. 55, Issue 7, Jul. 20, 2009, pp. 1-23.

Li, Chun et al., Modified Successive Cancellation List Decoding Algorithm for Polar Codes., Jan. 31, 2015, pp. 1-4.

Tal, Ido et al., List Decoding of Polar Codes, 2011 IEEE International Symposium on Information Theory Proceedings, Jul. 31, 2011, pp. 1-5.

Guo, Jianfeng et al., Multi-CRC Polar Codes and Their Applications, IEEE Communications Letters, vol. 20, No. 2, Feb. 2016, pp. 212-215.

\* cited by examiner $$G_2 = \begin{bmatrix} 1 & 0 \\ 1 & 1 \end{bmatrix} \leftarrow 100$$

$$G_2^{\otimes 2} = \begin{bmatrix} G_2 & 0 \\ G_2 & G_2 \end{bmatrix}$$

$$G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \leftarrow 102$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \leftarrow 104$$

FIG. 1

CONCATENATED AND SLIDING-WINDOW POLAR CODING

FIELD

The present application relates to Polar coding techniques and to encoders and decoders for Polar codes, for example for wireless communication applications.

BACKGROUND

Polar codes are based on Kronecker product matrices. $G = F^{\otimes m} = F \otimes \ldots \otimes F$ is the m-fold Kronecker product of a seed matrix F.

SUMMARY

In one aspect, there is provided a method involving processing $K_1$ information bits to produce a $u_1$-bit error-detecting code (EDC), processing $K_2$ information bits to produce a $u_2$-bit EDC, and producing an input vector comprising a first sequence of input bits, a second sequence of input bits, and a plurality of frozen bits for a Polar code. The first sequence of input bits includes the $K_1$ information bits and the $u_1$ bit EDC, the second sequence of input bits includes the $K_2$ information bits and the $u_2$-bit EDC, and the first sequence of input bits occurs in the input vector prior to the second sequence of input bits. The method involves multiplying the input vector by a generator matrix for the Polar code to produce a first codeword, and transmitting or storing the first codeword.

Optionally, the generator matrix for the Polar code is an m-fold Kronecker product matrix $G_2 \otimes^m$, where $$G_2 = \begin{bmatrix} 1 & 0 \\ 1 & 1 \end{bmatrix} \text{ or } G_2 = \begin{bmatrix} 1 & 1 \\ 0 & 1 \end{bmatrix}.$$

Optionally, the $u_1$-bit EDC and the $u_2$-bit EDC are cyclic redundancy codes (CRC).

Optionally, the method also involves processing a sequence of K information bits to produce a $u_3$-bit EDC. The produced input vector further includes a third sequence of input bits, and the third sequence of input bits includes the sequence of K information bits and the $u_3$-bit EDC. The second sequence of input bits occurs in the input vector prior to the third sequence of input bits.

Optionally, the $K_1$ information bits are information bits of a first message, and the $K_2$ information bits are leading information bits of a second message.

Optionally, the method also involves encoding the second message with a Polar encoder to produce a second codeword.

Optionally, the second message contains $K_3$ information bits after the $K_2$ information bits, and a $u_3$-bit EDC generated from the $K_2$ and the $K_3$ information bits in combination.

Optionally, the method also involves transmitting the first codeword prior to transmitting the second codeword.

Optionally, the method also involves transmitting the first codeword in temporal proximity to transmitting the second codeword.

Optionally, the method also involves transmitting, at a first power level, the first codeword; and transmitting, at a second power level, the second codeword. The first power level is higher than the second power level.

Optionally, the method is performed at a first base station in communication with a user equipment (UE) device. The method also involves receiving the $K_2$ information bits from a second base station in communication with the UE device, and transmitting the first codeword by the first base station to the UE device.

Optionally, the first base station receives the $K_2$ information bits over a backhaul connection between the first base station and the second base station.

In another aspect, there is provided a method involving receiving a first word, where the first received word is based on a first codeword. The first codeword has a plurality of bits produced by multiplying an input vector by a Polar code generator matrix, the input vector has a first sequence of input bits, a second sequence of input bits, and a plurality of frozen bits for the Polar code. The first sequence of input bits has $K_1$ information bits and a $u_1$-bit error-detecting code (EDC), the second sequence of input bits has $K_2$ information bits and a $u_2$-bit EDC, and the first sequence of input bits occurs in the input vector prior to the second sequence of input bits. The method then involves decoding the first received word.

Optionally, the Polar code generator matrix is an m-fold Kronecker product matrix $G_2 \otimes^m$, where $$G_2 = \begin{bmatrix} 1 & 0 \\ 1 & 1 \end{bmatrix} \text{ or } G_2 = \begin{bmatrix} 1 & 1 \\ 0 & 1 \end{bmatrix}.$$

Optionally, the $u_1$-bit EDC and the $u_2$-bit EDC are cyclic redundancy codes (CRC).

Optionally, decoding the first received word involves processing the first received word to produce a first decoded vector. The first decoded vector is produced by generating successive levels of a binary decision tree, each level corresponding to a decision on a respective bit, where each path in the decision tree represents a possible partial decoded non-frozen bit sequence and has a corresponding likelihood. For a first $K_1+u_1$ levels of the decision tree after the root, when a number of paths in the decision tree grows beyond a threshold $L_1$, all but the most probable $L_1$ paths are discarded. At level $K_1+u_1$ of the decision tree, the $u_1$ bit EDC represented in each respective surviving path is used to determine a path of the surviving paths representing a first sequence of $K_1$ decoded bits for the first decoded vector, and all other paths are discarded. For a second $K_2+u_2$ levels of the decision tree, when a number of paths in the decision tree grows beyond a threshold $L_2$, all but the most probable $L_2$ paths are discarded. At level $K_1+u_1+K_2+u_2$ of the decision tree, the $u_2$-bit EDC represented in each respective surviving path is used to determine a path of the surviving paths representing a second sequence of $K_2$ decoded bits, and all other paths are discarded.

Optionally, the method also involves including the second sequence of $K_2$ decoded bits in the first decoded vector.

Optionally, the input vector also includes a third sequence of input bits having $K_3$ information bits and a $u_3$-bit EDC, and the second sequence of input bits occurs in the input vector prior to the third sequence of input bits. The method also involves processing the first received word to produce the first decoded vector. This involves, for a third $K_3+u_3$ levels of the decision tree, when a number of paths in the decision tree grows beyond a threshold $L_3$, discarding all but the most probable $L_3$ paths. At level $K_1+u_1+K_2+u_2+K_3+u_3$ of the decision tree, the $u_3$-bit EDC represented in each respective surviving path is used to determine a path of the surviving paths representing a third sequence of $K_3$ decoded bits. The third sequence of $K_3$ decoded bits is included in the first decoded vector.

Optionally, the method also includes receiving a second word based on a second codeword. The second codeword includes a plurality of bits produced by multiplying a second input vector by a Polar code generator matrix. The second input vector includes a third sequence of input bits and a plurality of frozen bits for the Polar code. The third sequence of input bits includes the $K_2$, information bits followed by $K_3$ information bits and a $u_3$-bit EDC. The method also includes using the $u_2$-bit EDC, determining whether the $K_2$ information bits were successfully decoded. If the $K_2$ information bits were successfully decoded, the second received word is processed to produce a second decoded vector. The processing includes using the $K_2$ information bits as the initial $K_2$ bits for the second decoded vector. Successive levels of a second binary decision tree are generated, each level corresponding to a decision on a respective bit, where each path in the second decision tree represents a possible partial decoded non-frozen bit sequence and has a corresponding likelihood. The $K_2$ information bits are treated as frozen bits. For $K_3+u_3$ levels of the decision tree after the root, when a number of paths in the decision tree grows beyond a threshold $L_3$, all but the most probable $L_3$ paths are discarded. At level $K_3+u_3$ of the decision tree, the $u_3$-bit EDC represented in each respective surviving path is used to determine a path of the surviving paths representing a third sequence of $K_3$ decoded bits. The third sequence of $K_3$ decoded bits is included in the second decoded vector.

Optionally, at least one of $L_1$, $L_2$, or $L_3$ depends on a power level at which the first message was transmitted or a power level at which the second message was transmitted.

Optionally, decoding the first received word includes processing the first received word to produce a decoded vector. The decoded vector is produced by generating, at least partly in parallel, successive levels of a first binary decision tree and successive levels of a second binary decision tree, where each path in each of the first and second decision trees represents a possible partial decoded non-frozen bit sequence and has a corresponding likelihood. For a first $K_1+u_1$ levels of the first decision tree after the root, when a number of paths in the first decision tree grows beyond a threshold $L_1$, all but the most probable $L_1$ paths are discarded. At level $K_1+u_1$ of the first decision tree, the $u_1$-bit EDC represented in each respective surviving path in the first decision tree is used to determine a path of the surviving paths representing a first sequence of $K_1$ decoded bits for the decoded vector. For a first $R_1$ levels of the second decision tree after the root, when a number of paths in the second decision tree grows beyond a threshold $L_2$, all but the most probable $L_2$ paths are discarded. For a subsequent $R_2$ levels of the second decision tree, when a number of paths in the decision tree grows beyond a threshold $L_3$, all but the most probable $L_3$ paths are discarded. At level $K_1+u_1+K_2+u_2$ of the second decision tree, the $u_2$-bit EDC represented in each respective surviving path of the second decision tree is used to determine a path of the surviving paths representing a second sequence of $K_2$ bits after the first sequence of $K_1$ bits for the decoded vector. $R_1$ is less than $K_1+u_1$ and $L_1$ is greater than $L_2$.

Optionally, at level $K_1+u_1$ of the second decision tree, the $u_1$-bit EDC represented in each respective surviving path of the second decision tree is used to determine whether one of the surviving paths of the second decision tree represents a correct decoding of the first sequence of $K_1$ decoded bits for the decoded vector. If the first decision tree is still being generated and if one of the surviving paths of the second decision tree represents a correct decoding of the first sequence of $K_1$ decoded bits for the decoded vector, generation of the first decision tree is terminated.

In yet another aspect, there is provided an apparatus including a processor configured to produce a first codeword by processing $K_1$ information bits to produce a $u_1$-bit error-detecting code (EDC), processing $K_2$ information bits to produce a $u_2$-bit EDC, producing an input vector comprising a first sequence of input bits, a second sequence of input bits, and a plurality of frozen bits for a Polar code. The first sequence of input bits includes the $K_1$ information bits and the $u_1$-bit EDC, the second sequence of input bits includes the $K_2$ information bits and the $u_2$-bit EDC, and the first sequence of input bits occurs in the input vector prior to the second sequence of input bits. The input vector is multiplied by a generator matrix for the Polar code to produce the first codeword. The apparatus also includes a transmitting device for transmitting the first codeword.

In still another aspect, there is provided an apparatus including a processor configured to implement a method described above or below to produce a first codeword, and a transmitting device for transmitting the first codeword.

In a further aspect, there is provided an apparatus including a receiving device for receiving a first word and a processor configured to decode the first received word. The first received word is based on a first codeword, where the first codeword includes a plurality of bits produced by multiplying an input vector by a Polar code generator matrix. The input vector includes a first sequence of input bits, a second sequence of input bits, and a plurality of frozen bits for the Polar code. The first sequence of input bits includes $K_1$ information bits and a $u_1$-bit error-detecting code (EDC), the second sequence of input bits includes $K_2$ information bits and a $u_2$-bit EDC. The first sequence of input bits occurs in the input vector prior to the second sequence of input bits.

In still a further aspect, there is provided an apparatus including a receiving device for receiving a first received word based on a first codeword, and a processor configured to implement a method described above or below to decode the first received word.

BRIEF DESCRIPTION OF THE DRAWINGS

Embodiments of the invention will be described in greater detail with reference to the accompanying drawings, in which:

FIG. 1 is a diagram showing how a Kronecker product matrix can be produced from a seed matrix;

DETAILED DESCRIPTION

FIG. 1 shows how a Kronecker product matrix can be produced from a seed matrix $G_2$ 100, where $$G_2 = \begin{bmatrix} 1 & 0 \\ 1 & 1 \end{bmatrix}.$$

Shown in FIG. 1 are the 2-fold Kronecker product matrix $G_2^{\otimes 2}$ 102 and the 3-fold Kronecker product matrix $G_2^{\otimes 3}$ 104. This approach can be continued to produce m-fold Kronecker product matrix $G_2^{\otimes m}$.

Figure 2:
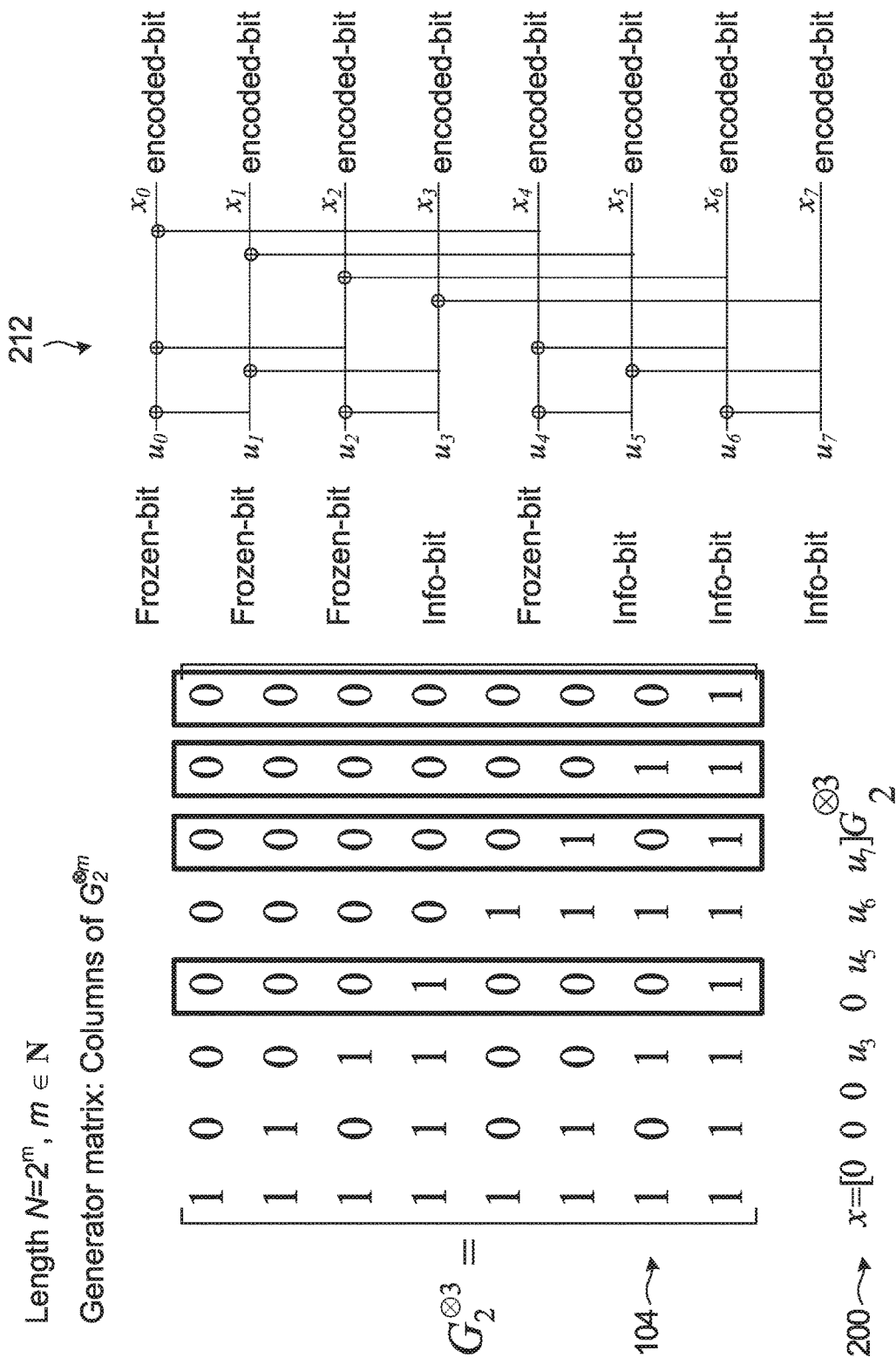
FIG. 2 is a diagram showing an example use of a Polar code generator matrix for producing codewords and a schematic illustration of an example Polar encoder.

A Polar code can be formed from a Kronecker product matrix based on matrix $G_2$. For a Polar code having codewords of length $N=2^m$, the generator matrix for the Polar code is $G_2^{\otimes m}$. An example using Kronecker product matrix $G_2^{\otimes 3}$ to produce codewords of length 8 is depicted in FIG. 2. A codeword x is formed by the product of an input vector u as a row vector and the Kronecker product matrix $G_2^{\otimes 3}$ 204 as indicated at 200. (Alternatively, codeword x may be formed by the product of a Kronecker product matrix $G_2^T{}^{\otimes 3}$ and input vector u as a column vector.) The input vector u is composed of frozen bits and information bits. In the specific example, $N=8$, so the input vector u is an 8 bit vector, and the codeword x is an 8-bit vector. The input vector has frozen bits in positions 0, 1, 2, and 4, and has information bits at positions 3, 5, 6, and 7. An example implementation of an encoder that generates codewords is indicated at 212, where the frozen bits are all set to 0. In the example encoder 212, the circle plus symbol represents modulo 2 addition. For the example of FIG. 2, an $N=8$ bit input vector is formed from $K=4$ information bits and $(N-K)=4$ frozen bits. Codes of this form are referred to as Polar codes and the encoder is referred to as a Polar encoder. Decoders for decoding Polar codes are referred to as Polar decoders.

In "Channel Polarization: A Method for Constructing Capacity-Achieving Codes for Symmetric Binary-Input Memoryless Channels" by E. Arikan, *IEEE Transactions on Information Theory*, vol. 55, no. 7 (July 2009) [Arikan], a theory relating to "channel polarization" of Polar codes was proved in section IV. Channel polarization is an operation which produces N "synthetic" channels from N independent copies of a binary-input discrete memoryless channel (B-DMC) such that, with increasing values of N, the new synthetic channels are polarized in the sense that their mutual information is either close to 0 (completely noisy channels) or close to 1 (perfectly noiseless channels). In other words, some bit positions of an input vector provided to an encoder will experience a completely noisy channel, i.e., have a relatively low reliability/low possibility to be correctly decoded when considered independently of other synthetic channels. Some bit positions of an input vector provided to an encoder will experience a very clean channel, i.e., have high possibility/high reliability to be correctly decoded when considered independently of other synthetic channels. In some cases, the reliability of a synthetic channel when considered independently of other synthetic channels may be referred to as the "capacity" of the synthetic channel. A specific example of a Polar code was described earlier in which the code is based on the m-fold Kronecker product of a specific matrix $G_2$. The use of this generator matrix results in channel polarization. More generally, any generator matrix that produces a channel polarization effect will be referred to herein as a Polar code generator matrix.

In Polar code construction, an attempt is made to put the information bits in the more "reliable" positions of an input vector, and to put frozen bits (i.e., bits already known to both encoder and decoder) in the more "unreliable" positions of the input vector. However, when information is transmitted over a physical channel, the reliability of a given bit position is also a function of the characteristics of the physical channel, such as the signal-to-noise ratio (SNR) and the bit error rate of the physical channel. In most applications, the frozen bits can be set to any value so long as the frozen bits sequence is known to both the encoder and the decoder. In conventional applications, the frozen bits are all set to zero.

Error-detecting code (EDC) bits can be included in the input vector to assist in decoding. In exemplary embodiments, a cyclic redundancy check (CRC) code is used as the EDC code, However, it should be understood that other EDC codes may also be used in some embodiments, such as Fletcher checksums, and that error-correcting codes may be used as EDCs. For descriptive simplicity, the embodiments described in this specification will be described using a CRC code as the EDC code.

Figure 3:
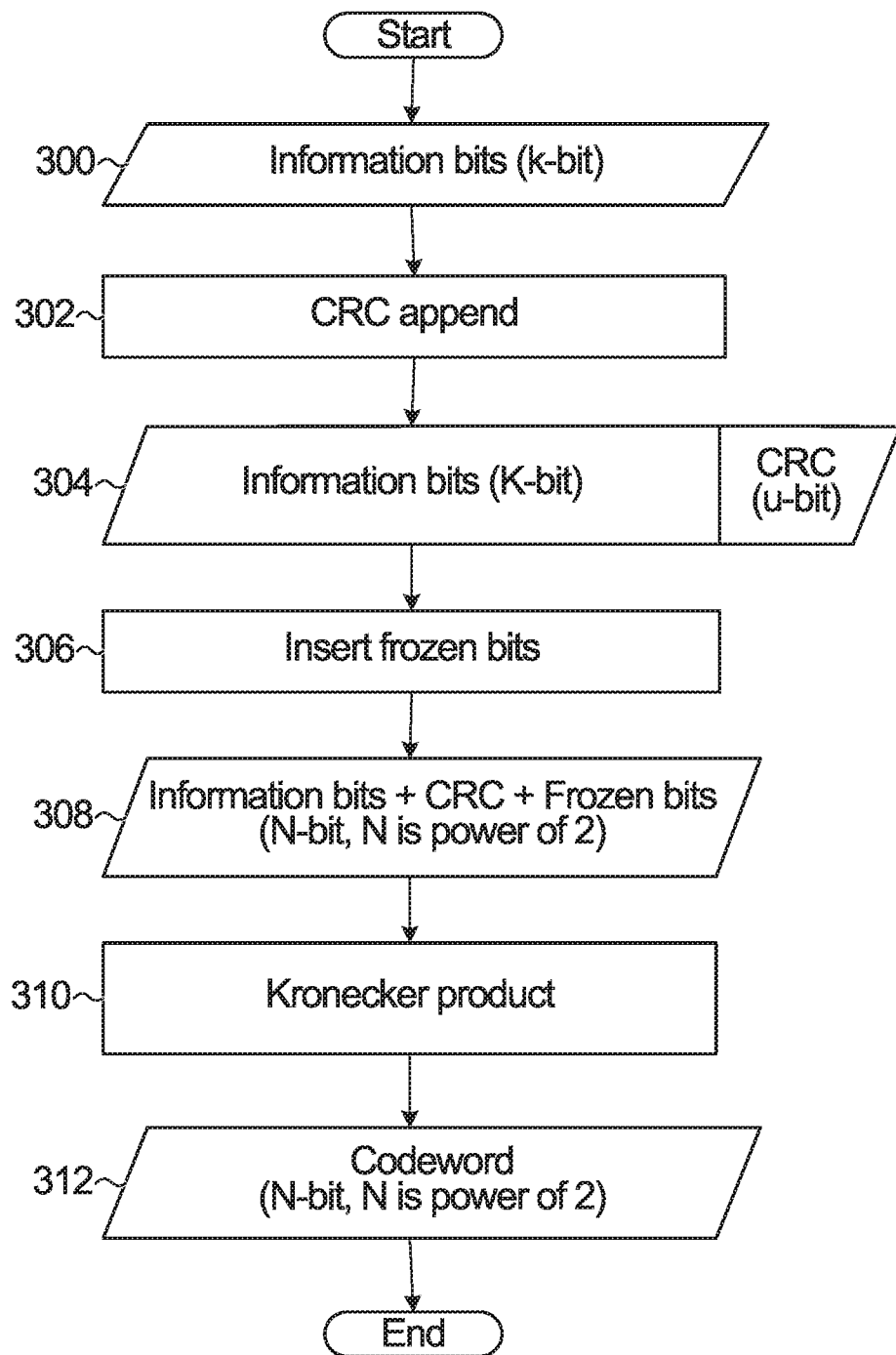
FIG. 3 is a flow diagram of a method for encoding information using a Polar code.

CRC bits are generated based on the information bits being transmitted. CRC bits are generally placed in the more reliable positions in the input vector, although CRC bits may also be placed in other positions in the input vector. CRC bits may be added to improve Polar code performance for short to moderate codeword lengths. For a very long codeword length Polar encoder, CRC bits may not be needed to further improve Polar code reliability, but are included to aid in decoding. During encoding, an N-bit input vector is formed from K information bits, a u-bit CRC, and (N−K−u) frozen bits. An example is depicted in FIG. 3. Starting with K information bits 300, a u-bit CRC is appended at 302 to produce, at 304, a set of input bits comprising the K information bits and the u-bit CRC. At 306, the (N−K−u) frozen bits are inserted to produce an N-bit input vector, at 308, with the K information bits, the u-bit CRC, and the (N−K−u) frozen bits, where N is a power of 2. The input vector 308 is then multiplied by a Kronecker product matrix consisting of a generator matrix for a Polar code at 310 to produce an N-bit codeword 312.

Figure 4:
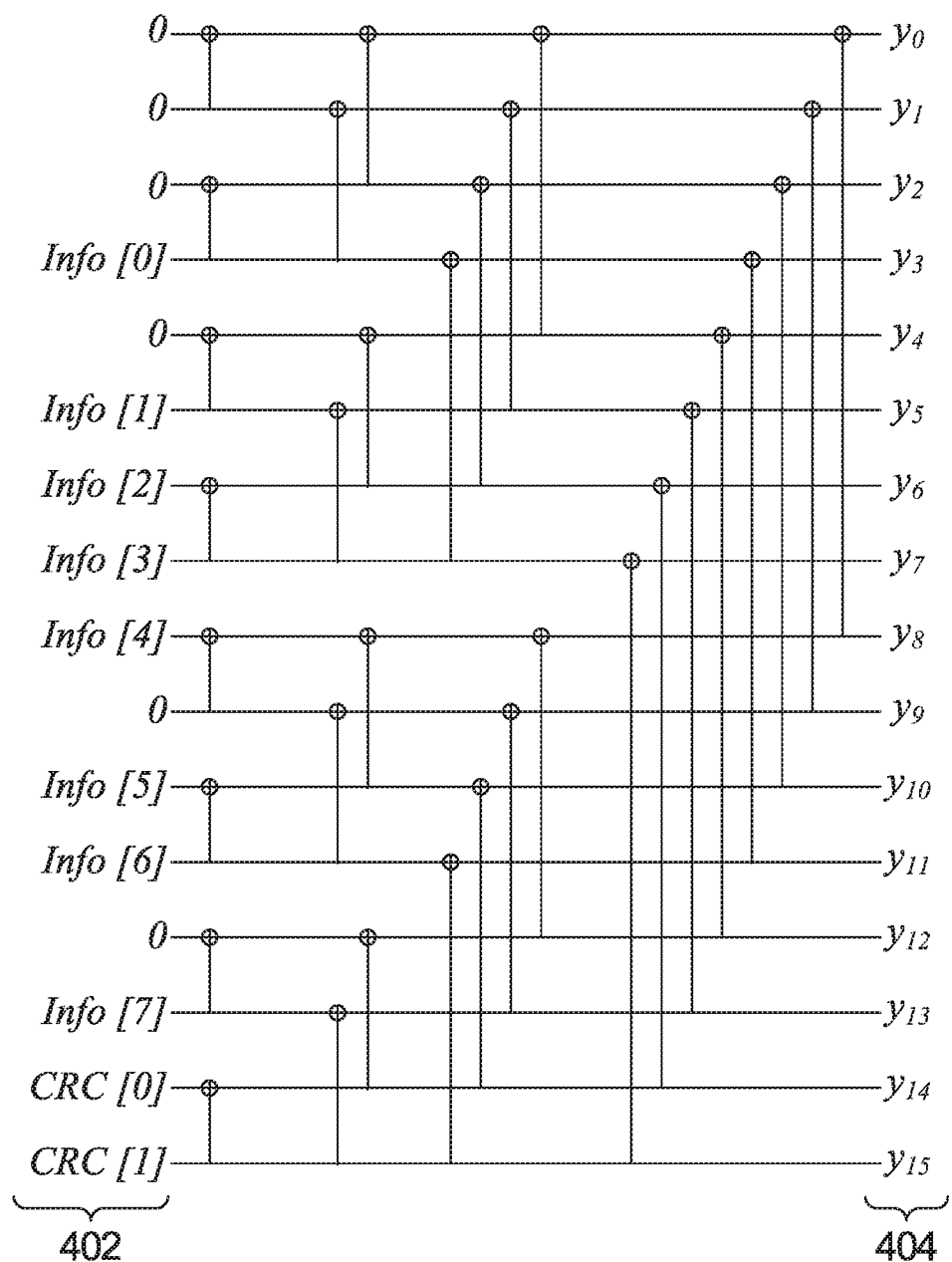
FIG. 4 is a schematic illustration of an example Polar encoder.

An example implementation of a Polar encoder including CRC bits is depicted in schematic form in FIG. 4, where the circle plus symbol represents modulo 2 addition. The encoder produces a codeword 404 from an input vector 402. In the example shown, N=16, K=8, u=2, and there are six frozen bits for a code rate of 0.5. The frozen bits, which are illustrated as having been set to zero, are inserted at positions 0, 1, 2, 4, 9, and 12 of the input vector 402. Information bits, denoted as Info[0] through Info[7], are provided at positions 3, 5, 6, 7, 8, 10, 11, and 13, respectively, of the input vector 402. Two CRC bits, denoted as CRC[0] and CRC[1], are provided at positions 14 and 15, respectively, of the input vector 402.

The input vector used by an encoder to produce a codeword is sometimes referred to as a message. A codeword may be transmitted over a channel, and a receiver may, in turn, receive a received word. Due to channel effects such as the transmitted codeword being subjected to noise, the received word may not be identical to the transmitted codeword. A decoder attempts to decode the received word to determine information bits in the originally transmitted message.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits and the CRC bits are unknown bits. A characteristic of some Polar decoders is that the unknown bits are decoded sequentially, for example the Polar decoding algorithm may be based on successive cancellation. Once a particular decision has been made regarding how an unknown bit is to be decoded, that bit does not, in such Polar decoders, have the chance to be changed or corrected, and the decoder moves on to decoding the next unknown bit. In other words, there is "no going back". A bit that was set at step i cannot be changed at step j>i. In addition, knowledge of the value of subsequent frozen bits is not taken into account, i.e., subsequent frozen bits, even though known to the decoder, will not help decode the current unknown bit.

In Arikan, a successive-cancellation algorithm is described for decoding Polar codes. Another type of Polar decoding algorithm with greater space efficiency and lower time complexity, referred to as a List decoder, is described in "List Decoding of Polar Codes" by Tal and Vardy, *Proceedings of the* 2011 *IEEE international Symposium on Information Theory*, pp. 1-5 (July 2011). In a List decoder, successive levels of a binary decision tree are generated, each level corresponding to a decision on a respective unknown bit. Each path in the decision tree from the root node to leaf nodes represents a possible partial decoded sequence of unknown bits and has a corresponding likelihood. The decision tree is generated in a breadth-first manner. During generation of the decision tree, at each level of the decision tree where the number of paths grows beyond a set threshold L, the L paths having the highest likelihood are identified, and the remaining paths are discarded, if the codeword includes encoded CRC bits for the previous information bits, once the decision tree is generated, each of the surviving paths that correspond to the decoded information bits is checked against the CRC bits represented in each of the surviving paths. The decoder then outputs as a decoded vector the information bits in the surviving path that passes the CRC check. If more than two paths pass the CRC check, the decoder selects for output the path that passes the CRC check and has the highest likelihood, that is, the survivor that passes the CRC check with the highest likelihood according to a metric. If no path passes the CRC check, or if the codeword does not include encoded CRC bits, the decoder selects for output the path that has the highest likelihood that is, the survivor with the highest likelihood according to a metric.

Figure 5:
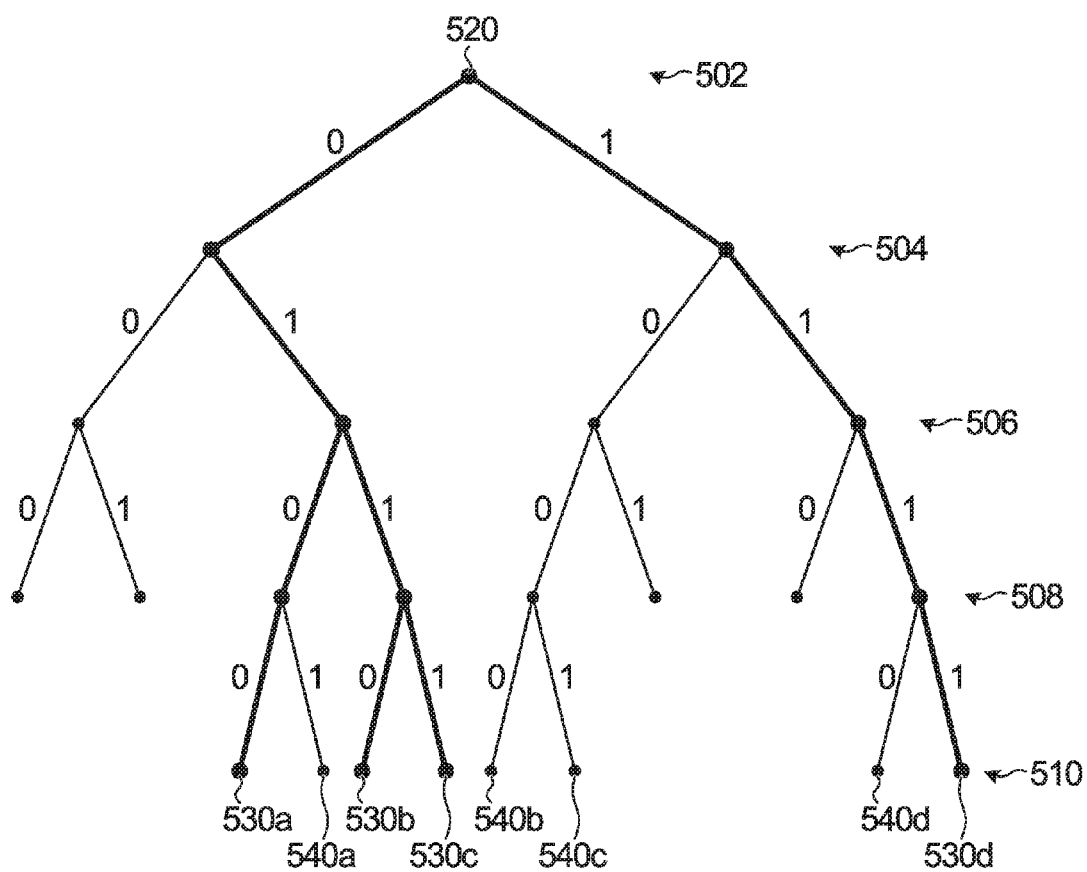
FIG. 5 is a diagram showing a portion of an example decision tree used in a List-type Polar decoder.

FIG. 5 is a diagram showing a portion of an example decision tree used in a List-type Polar decoder, where the value of L is set to 4. Five levels 502, 504, 506, 508, 510 of the decision tree are illustrated, which are referred to as levels 0, 1, 2, 3, and 4, respectively. Although five levels are illustrated, it should be understood that a decision tree to decode M unknown bits would have M+1 levels. The child nodes of root node 520 represent possible choices for a first unknown bit, and subsequent child nodes represent possible choices for subsequent bits. Leaf node 530a, for example, represents the following possible partial decoded unknown bit sequence: 0, 1, 0, 0. At level 3 (508), the number of possible paths is greater than L, so L paths having the highest likelihood have been identified, and the remaining paths have been discarded. At level 4 (510), the number of possible paths is again greater than L, so L paths having the highest likelihood have been identified, and the remaining paths will again be discarded. In the example shown, the paths terminating in leaf nodes 530a, 530b, 530c, and 530d represent the highest likelihood paths. Each of these highest likelihood paths is drawn with thick lines. The paths terminating in leaf nodes 540a, 540b, 540c, 540d are the lower likelihood paths which will be discarded.

In some communication applications, codewords are transmitted over a channel in units referred to as blocks. Blocks may be transmitted sequentially or in parallel. Some example block sizes are 1024 bits (1K), 2048 bits (2K), 4096 bits (4K), and 8192 bits (8K), although other block sizes are possible. In some communication applications, it is desirable for block sizes to not exceed certain sizes due to processing latency issues.

Figure 6:
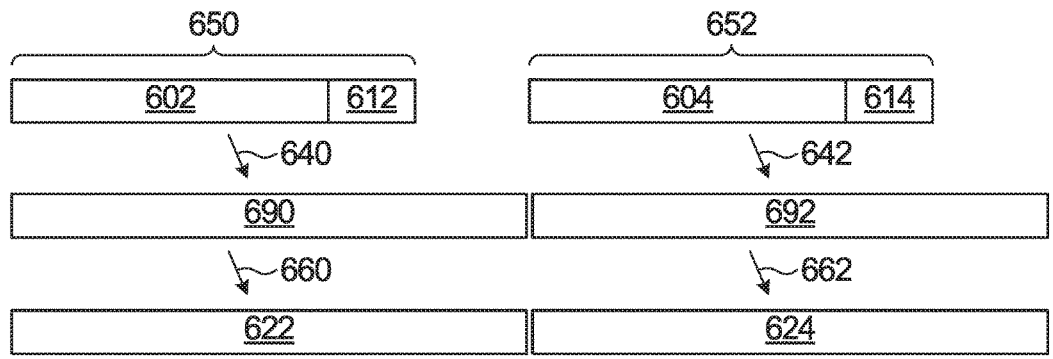
FIG. 6 is an illustration of two sequences of input bits being independently encoded into two codewords for transmission.

FIG. 6 is an illustration of two sequences of inputs bits 650, 652 being independently encoded into two codewords 622, 624 for transmission. The first sequence of input bits 650 consists of $K_1$ information bits 602 and a $u_1$-bit CRC 612 computed based on the $K_1$ information bits 602. The second sequence of input bits 652 consists of $K_2$ information bits 604 and a $u_2$-bit CRC 614 computed based on the $K_2$ information bits 604.

The first sequence of input bits 650 is processed by a Polar encoding process to generate a first codeword 622 of length N. The second sequence of input bits 652 is processed by a Polar encoding process to generate a second codeword 624 of length N. The Polar encoding process for the first sequence of input bits 650 comprises a step 640 of inserting frozen bits into the first sequence of input bits 650 to produce a first input vector 690 of length N, and then multiplying 660 the first input vector 690 by a Polar code generator matrix, as described above with respect to FIG. 3, steps 306 and 310. The polar encoding process for the second sequence of input bits 652 comprises applying the same sequence of operations with respect to the second sequence of input bits 652. That is, a step 642 of inserting frozen bits into the second sequence of input bits 652 is performed to produce a second input vector 692 of length N, and then multiplying 662 the second input vector 692 by a Polar code generator matrix. Frozen bits need not be inserted into the same positions in the first input vector and the second input vector. The first sequence of input bits 650 and second sequence of input bits 652 are encoded independently to each other, that is, the Polar encoding processes for each sequence of input bits do not depend on one another.

Figure 7:
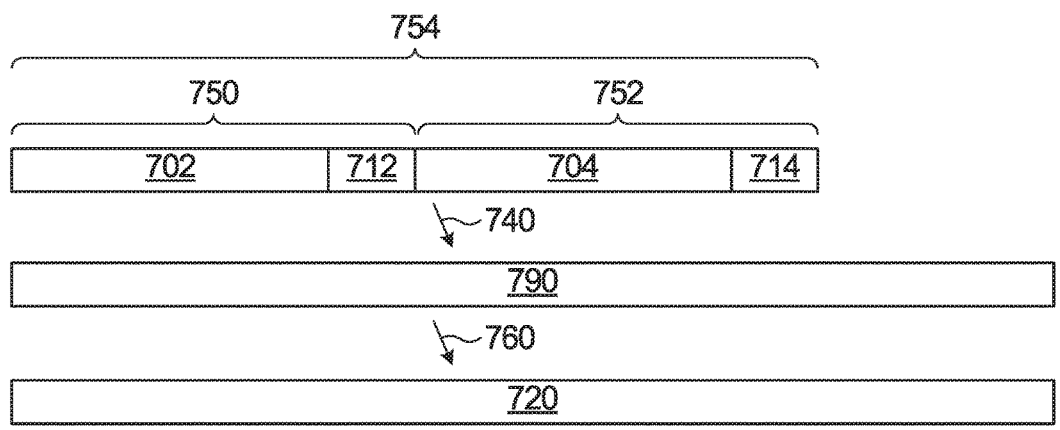
FIG. 7 is an illustration of two sequences of input bits being concatenated and encoded into a combined codeword for transmission.

FIG. 7 is an illustration of two sequences of input bits 750, 752 being encoded into a combined codeword 720 for transmission. The first sequence of input bits 750 consists of $K_1$ information bits 702 and a $u_1$ bit CRC 712 computed based on the $K_1$ information bits 702. The second sequence of input bits 752 consists of $K_2$ information bits 704 and a $u_2$-bit CRC 714 computed based on the $K_2$ information bits 704. Although the $u_1$-bit CRC 712 is shown appended to the $K_1$ information bits 702, and the $u_2$-bit CRC 714 is shown appended to the $K_2$ information bits 704, in some embodiments, the CRC bits and the information bits within each sequence 750, 752 may be arranged in a different order. The first sequence of input bits 750 and the second sequence of input bits 752 are concatenated to form a sequence 754 of size $K_1+u_1+K_2+u_2$.

The concatenated sequence 754 is processed by a Polar encoding process to generate a codeword 720 of length N. The Polar encoding process comprises a step 740 of inserting frozen bits into the concatenated sequence 754 to produce an input vector 790 of length N, and then multiplying 760 the input vector by a Polar code generator matrix, as described below with respect to FIG. 8, step 808. It should be understood that the value of N representing the length of codeword 720 illustrated in FIG. 7 may be different than the value of N referred to in the above discussion of FIG. 6. For example, if each of the first sequence of input bits 650 and the second sequence of input bits 652 in FIG. 6 are the same length as the first sequence of input bits 750 and the second sequence of input bits 752 in FIG. 7, codeword 720 will be twice as long as each of first codeword 622 and second codeword 624 in FIG. 6.

In some embodiments, $K_1$ and $K_2$ are equal and $u_1$ and $u_2$ are equal. In such embodiments, the Polar encoding is referred to herein as symmetric concatenated Polar coding, or alternatively as symmetric block-combined Polar coding. The codeword 720 is referred to herein as a symmetric concatenated codeword, or alternatively as a symmetric block-combined codeword. Although FIG. 7 illustrates two sequences of input bits 750, 752 being concatenated and encoded, it should be understood that in other embodiments more sequences of input bits may be concatenated and encoded to produce the codeword 720.

Figure 8:
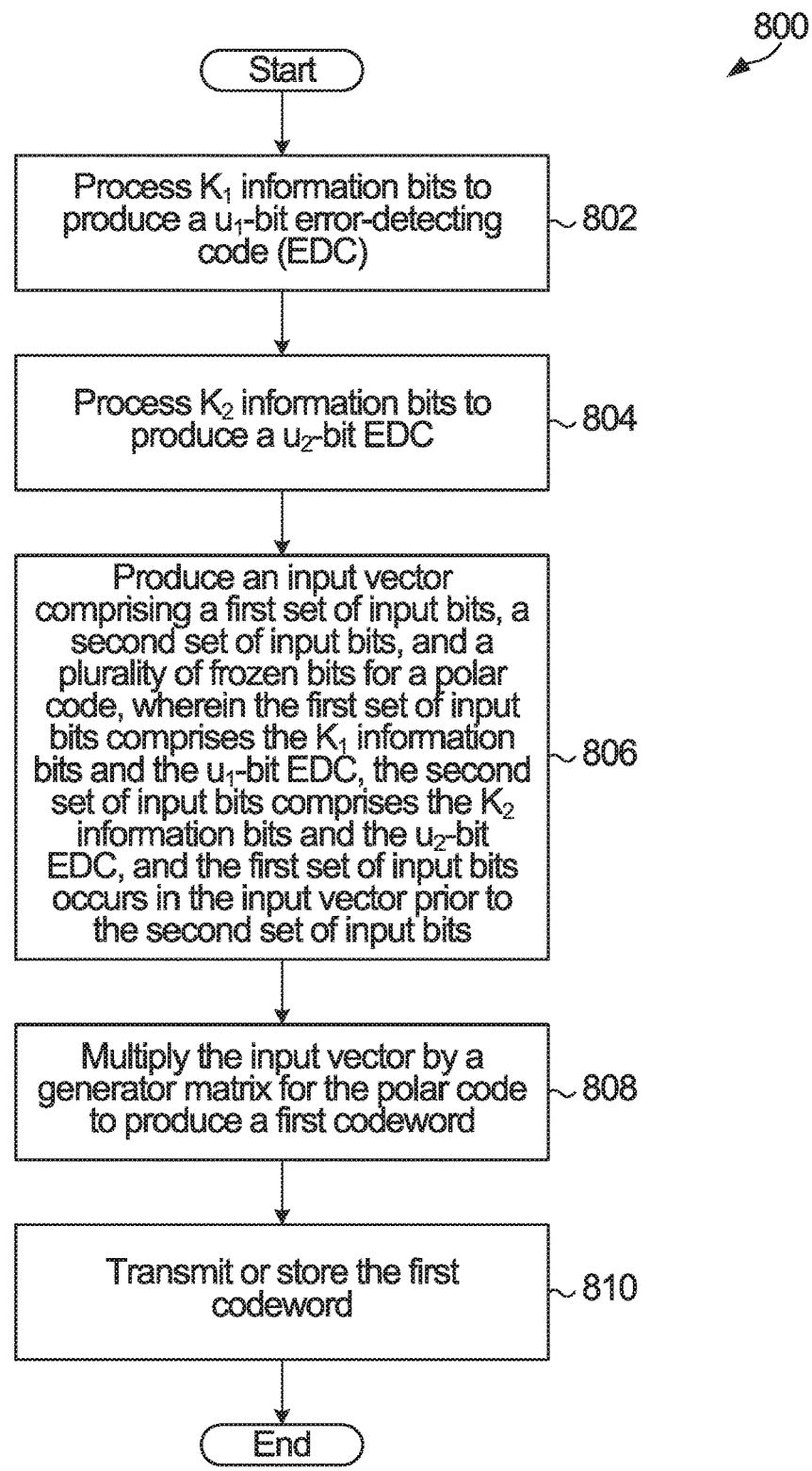
FIG. 8 is a flow diagram of a method for Polar encoding to produce a combined codeword as shown in FIG. 7.

FIG. 8 is a flow diagram of a method for Polar encoding to produce a codeword as shown in FIG. 7. For the purpose of generality, the steps of FIG. 8 are illustrated as generating EDCs, although as explained previously, it should be understood that many embodiments will make use of CRCs as a particular form of EDC. At step 800, $K_1$ information bits are processed to produce a $u_1$-bit EDC, and at step 802, $K_2$ information bits are processed to produce a $u_2$-bit EDC. In some embodiments, $K_1$ equal to $K_1$.

The method then proceeds to step 804, where an input vector of size N, where N is a power of 2, is produced by combining all of the following: a first sequence of input bits that includes the $K_1$ information bits and the $u_1$-bit EDC, a second sequence of input bits that includes the $K_2$ information bits and the $u_2$-bit EDC, and a plurality of frozen bits for a Polar code. The input vector is produced so that the first sequence of input bits occurs in the input vector prior to the second sequence of input bits. The positions of the bits of the $u_1$-bit EDC within the first sequence of input bits, the positions of the bits of the $u_2$-bit EDC within the second sequence of input bits, and the locations of the frozen bits are design choices that must be known to both the encoder and the decoder. In some embodiments, the positions of the $u_1$ bit EDC and the $u_2$-bit EDC are predetermined or selected based on one or more computations of transmission reliability of synthetic channels of the Polar code corresponding to individual bit positions of the input vector. The computations may be made based on one or more assumptions about expected physical channel characteristics, such as assumed SNRs and/or assumed erasure probabilities in a BEC channel model. As such, the bit positions selected based on these computations may not be optimal for an actual physical channel being used for communication. In some embodiments, the EDCs are placed in individual bit positions of the input vector that correspond to synthetic channels meeting a reliability criterion. For example, in some embodiments, one or more of the EDCs are placed in individual bit positions of the input vector that correspond to synthetic channels computed to have at least a specified level of reliability under one or more assumed physical channel conditions. In some embodiments, the information bits are also placed in individual bit positions of the input vector that meet a reliability criterion. For example, the information bits may be placed in individual bit positions of the input vector that correspond to synthetic channels computed to have the highest remaining reliability under the one or more assumed physical channel conditions after the EDC bits have been placed. The frozen bits may be placed in individual bit positions of the input vector that are computed to have a low level of reliability under the assumed physical channel conditions.

At step 808, the input vector is multiplied by a Polar code generator matrix to produce a codeword of length N. Finally, the codeword is either transmitted over a physical channel or stored at step 810.

Figure 9:
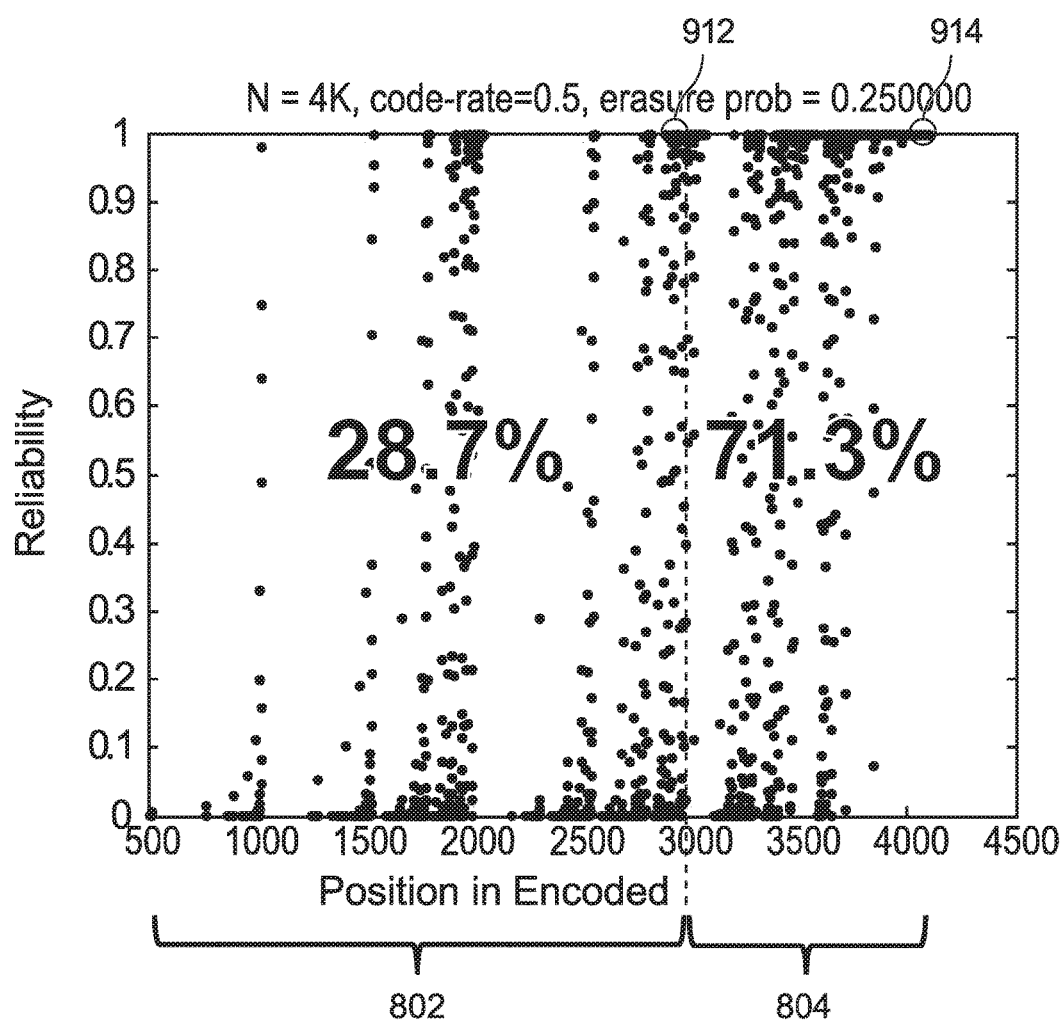
FIG. 9 is a graph showing computed values of the reliability of some synthetic channels of a Polar code for transmitting an example codeword encoded according to the method of FIG. 8.

FIG. 9 is a graph showing computed values of the reliability of some synthetic channels of a Polar code for transmitting an example codeword encoded according to the method of FIG. 8, where a CRC is employed as the EDC. For this example, to compute the reliability of the synthetic channels, the performance of a physical channel in transmitting the example codeword is modeled as a memoryless binary erasure channel (BEC) with an erasure probability of 0.25. (Such a BEC channel model may be regarded as an approximation of an additive white Gaussian noise (AWGN) channel model.) The example codeword has length N=4096, and $K_1+u_1=K_2+u_2=1024$, resulting in a code rate of 0.5.

The x-axis of the graph of FIG. 9 represents each individual information (non-frozen) bit position in the input vector used to produce the example codeword, and the y-axis of the graph represents the computed transmission reliability of a synthetic channel of the Polar code corresponding to a given individual bit position in the input vector. As explained earlier, the reliability of a synthetic channel may also be referred to as the "capacity" of the synthetic channel.

A point is plotted on the graph of FIG. 9 at each bit position of a non-frozen bit in the input vector. Each of the plotted points shows the computed transmission reliability of a synthetic channel of the Polar code for the synthetic channel's respective bit position in the input vector. A first group of plotted points 802 contains 1024 (i.e., $K_1+u_1$) points corresponding to the locations of the $K_1$ information bits and the $u_1$ CRC bits in the input vector. A second group of plotted points 804 contains 1024 (i.e., $K_2+u_2$) points corresponding to the locations of the $K_2$ information bits and the $u_2$ CRC bits in the input vector over a 4096-bit (i.e., $(K_1+u_1)/R_1+(K_2+u_2)/R_2$, where $R_1$ and $R_2$ represent the code rate of 0.5) codeword In the example depicted in FIG. 9, the non-frozen bit positions in the input vector were selected by computing the reliability of each of the bit positions in the input vector, and then identifying the most reliable 2048 bit positions. The most reliable 2048 bit positions were then sequentially partitioned into a first group of bit positions corresponding to the first group of plotted points 802 and a second group of bits positions corresponding to the second group of plotted points 804. The $K_1$ information bits and the $u_1$ CRC bits were placed in the first group of bit positions. The $K_2$ information bits and the $u_2$ CRC bits were placed in the second group of bit positions. More particularly, in the specific example illustrated, the $u_1$ CRC bits were placed in bit positions corresponding to plotted points 912, and the $u_2$ CRC bits were placed in bit positions corresponding to plotted points 914, because these bit positions satisfy a desired reliability criterion, namely they are among the plotted points with the highest computed reliabilities. Frozen bits were placed in the remaining bit positions in the input vector. As can be seen in FIG. 9, the first group of plotted points 802 and second group of plotted points 804 are distributed unevenly along the x-axis. This is because, due to the channel polarization principle described earlier, synthetic channels at increasingly higher bit positions tend to have a higher reliability. In other words, reliability is unequally distributed among the bit positions of the input vector. In the example provided, the synthetic channels corresponding to the first group of plotted points 802 have an average reliability of 28.7%, while the synthetic channels corresponding to the second group of plotted points 804 have an average reliability of 71.3%.

Figure 10:
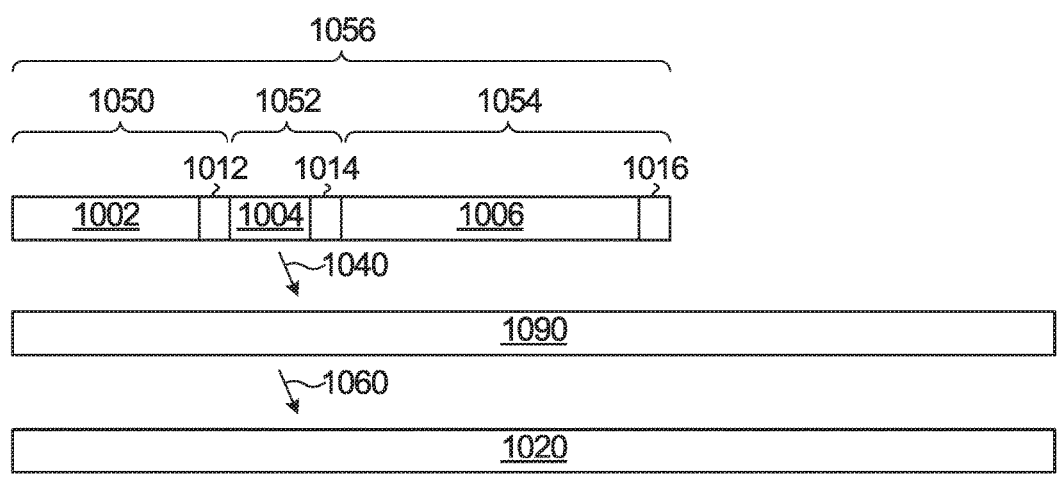
FIG. 10 is an illustration of three sequences of input bits being concatenated and encoded into a combined codeword for transmission.

As noted previously, more than two sequences of input bits may be concatenated and then encoded into a combined codeword. FIG. 10 is an illustration of three sequences of input bits 1050, 1052, 1054 being concatenated into a concatenated sequence 1056 and encoded into a combined codeword 1020 for transmission. The first sequence of input bits 1050 consists of $K_1$ information bits 1002 and a $u_1$-bit CRC 1012 computed based on the $K_1$ information bits 1002. The second sequence of input bits 1052 consists of $K_2$ information bits 1004 and a $u_2$-bit CRC 1014 computed based on the $K_2$ information bits 1004. The third sequence of input bits 1054 consists of $K_3$ information bits 1006 and a $u_3$-bit CRC 1016 computed based on the $K_3$ information bits 1006. The three sequences of input bits 1050, 1052, 1054 are concatenated to form a sequence 1056 of size $K_1+u_1+K_2+u_2+K_3+u_3$.

The concatenated sequence 1056 is processed by a Polar encoding process to generate a codeword 1020 of length N. The Polar encoding process comprises a step 1040 of inserting frozen bits into the concatenated sequence 1056 to produce an input vector 1090 of length N, and then multi-plying 1060 the input vector 1090 by a Polar code generator matrix, as described previously above, for example with respect to FIG. 8, step 808.

In some embodiments, not all of $K_1$, $K_2$, and $K_3$ are equal. In such embodiments, the Polar encoding is referred to herein as asymmetric concatenated Polar coding, or alternatively as asymmetric block-combined Polar coding. The codeword 1020 produced is referred to herein as an asymmetric concatenated codeword, or alternatively as an asymmetric block-combined codeword. In some embodiments, $K_1$ differs from $K_2$. In some embodiments, $K_1$, $K_2$, and $K_3$ all differ from each other. In some embodiments, $K_1+K_2$ is equal to $K_3$ and $u_1+u_2$ is equal to $u_3$. In an example embodiment where $K_1+K_2$ is equal to $K_3$, the first sequence of input bits 1050 and the second sequence of input bits 1052 is generated by partitioning a sequence of $K_1+K_2$ information bits prior to calculating CRCs 1012 and 1014.

In some cases, asymmetric concatenated Polar coding may facilitate distributing CRC bits in bit positions in the input vector that better satisfy a reliability criterion than symmetric concatenated Polar coding. Although FIG. 10 illustrates three sequences of input bits 1050, 1052, 1054 being concatenated and encoded, it should be understood that in other embodiments fewer or more sequences of input bits may be concatenated and encoded for output as the codeword 1020.

Figure 11:
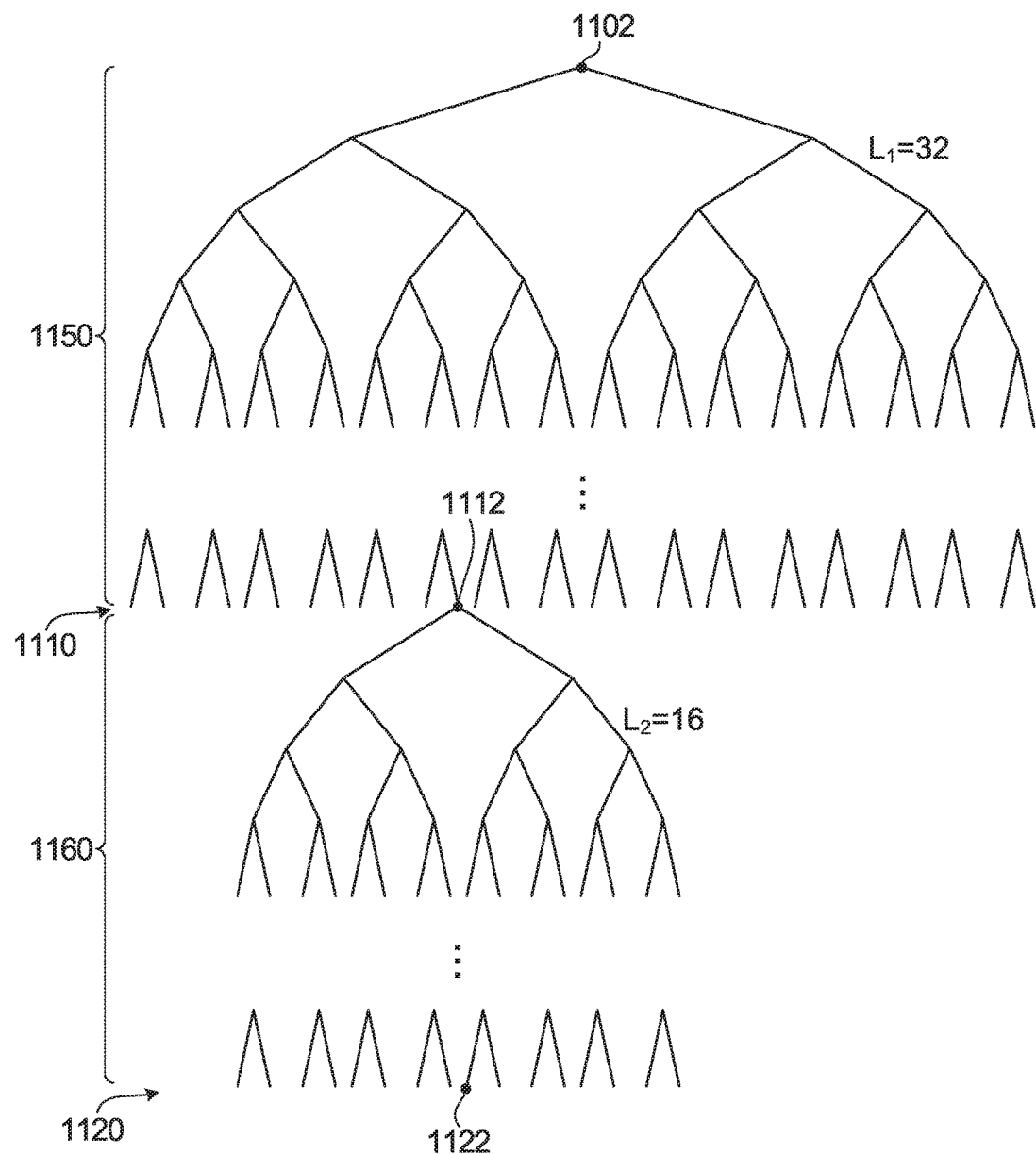
FIG. 11 is a diagram showing an example decision tree for decoding a codeword produced by concatenated Polar encoding.

FIG. 11 is a diagram showing an example decision tree for decoding a concatenated codeword, where the codeword was sequentially encoded by combining a sequence of $K_1$ information bits with a $u_1$-bit CRC and a sequence of $K_2$ information bits with a $u_2$-bit CRC. The decision tree has $K_1+u_1+K_2+u_2+1$ levels, which are referred to as levels 0 through $K_1+u_1+K_2+u_2$, respectively. The decision tree was generated in a breadth-first manner, with each level of the decision tree corresponding to a decision on a respective unknown bit. Each path in the decision tree from the root node to leaf nodes represents a possible partial decoded sequence of unknown bits and has a corresponding likelihood.

During generation of the decision tree, for each of the first $K_1+u_1+1$ levels 1150 beginning with root node 1102, when the number of possible paths has grown greater than $L_1=32$, the $L_1$ paths having the highest likelihood have been identified, and the remaining paths have been discarded. At level $K_1+u_1$ (1110), the sequence of $K_1$ information bits represented in each of the surviving paths has been evaluated against the $u_1$-bit CRC in that path. The last node in the surviving path that passed this CRC check is shown as node 1112. Accordingly, the path from root node 1102 to node 1112 contains the decoded sequence of $K_1$ information bits. The other paths at level $K_1+u_1$ (1110) are discarded.

For each of the subsequent $K_2+u_2$ levels 1160 beginning with node 1112, when the number of possible paths has grown greater than $L_2=16$, the $L_2$ paths having the highest likelihood have been identified, and the remaining paths have been discarded. At level $K_1+u_1+K_2+u_2$ (1120), the sequence of $K_2$ information bits represented in each of the surviving paths has been evaluated against the $u_2$-bit CRC in that path. The last node in the surviving path that passed this CRC check is shown as node 1122. Accordingly, the path from node 1112 to node 1122 contains the decoded sequence of $K_2$ information bits.

It should be understood that the values of $L_1$ and $L_2$ illustrated in FIG. 11 are merely exemplary, and that other values may be chosen for decoding a concatenated codeword. In some embodiments, $L_1$ and $L_2$ are equal. In some embodiments, $L_2$ is less than $L_1$. Using a value for $L_2$ that is less than the value of $L_1$ may reduce computational and space requirements for generating the decision tree, and therefore may improve the performance, such as the throughput, of a decoder that generates the decision tree. Because reliability of synthetic channels corresponding to individual bit positions tends to increase along the length of an encoded input vector, some values for $L_2$ that are less than the value of $L_1$ may improve the throughput of a decoder that generates the decision tree with minimal impact on the overall block error rate of the decoder.

Figure 12A:
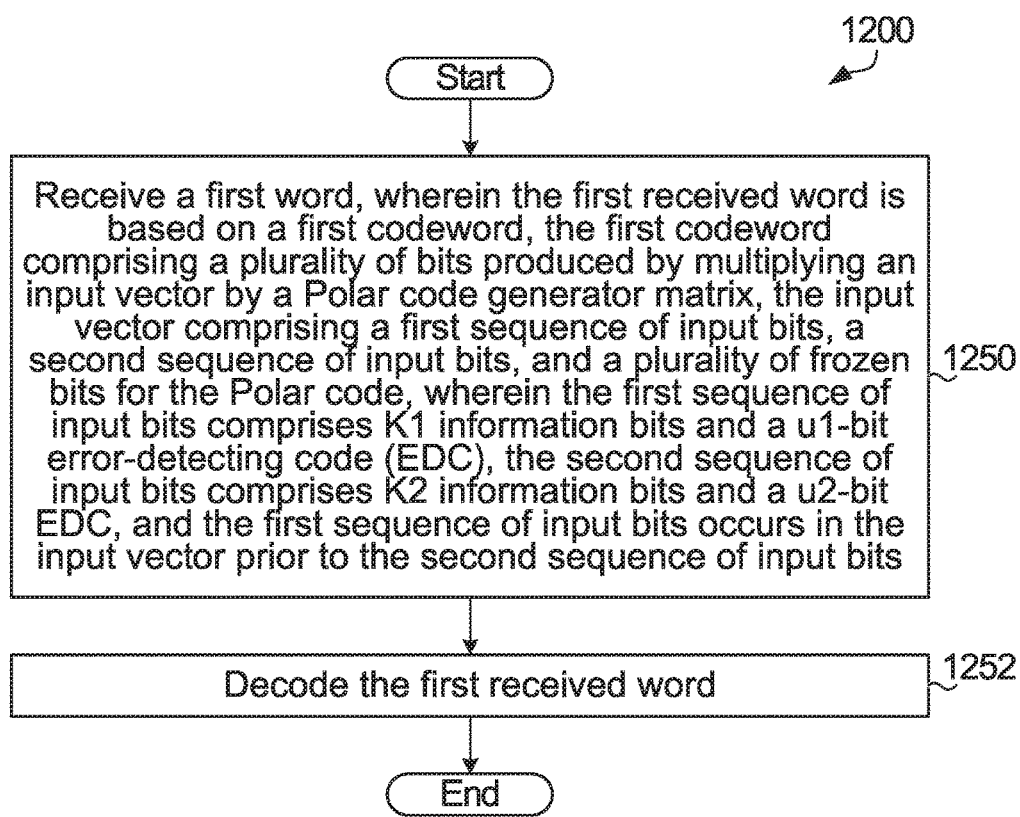
FIG. 12A is a flow diagram of a method for Polar decoding.

FIG. 12A is flow diagram of a method 1200 for Polar decoding. For the purpose of generality, the steps of FIG. 12A are illustrated as involving a received word using EDCs, although as explained previously, it should be understood that many embodiments will make use of CRCs as a particular form of EDC. At step 1250, a first word is received. The first received word is based on a first codeword, where the first codeword contains a plurality of bits produced by multiplying an input vector by a Polar code generator matrix, where the input vector contained a first sequence of input hits, a second sequence of input bits, and a plurality of frozen bits for the Polar code. The first sequence of input hits used for producing the codeword contained $K_1$ information bits and a $u_1$-bit EDC, and the second sequence of input bits contained $K_2$ information bits and a $u_2$-bit EDC. The first sequence of input bits occured in the input vector prior to the second sequence of input bits. The positions of the bits of the $u_1$-bit EDC within the first sequence of input bits, the positions of the bits of the $u_2$-bit EDC within the second sequence of input bits, and the locations of the frozen bits are known to both the encoder and the decoder. At step 1252, the first received word is decoded.

Figure 12B:
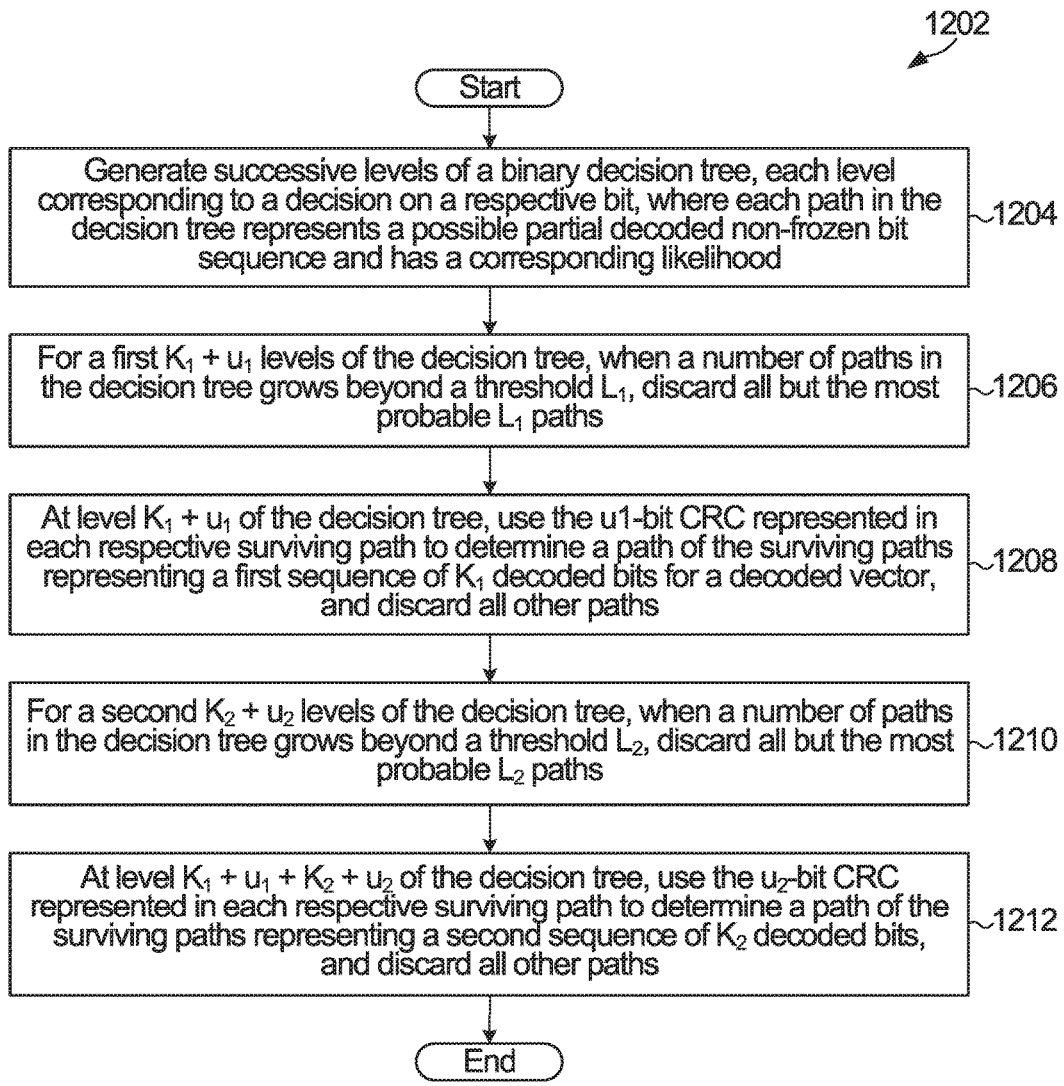
FIG. 12B is a flow diagram of a method for Polar decoding that involves generating a decision tree as shown in FIG. 11.

FIG. 12B is a flow diagram of a method 1202 for Polar decoding the first received word of FIG. 12A, the method involving generating a decision tree as shown in FIG. 11, where CRCs are employed as the particular form of EDC.

At step 1204, successive levels of a binary decision tree are generated, each level corresponding to a decision on a respective bit, where each path in the decision tree represents a possible partial decoded non-frozen bit sequence and has a corresponding likelihood.

During the decision tree generation, at step 1206, for a first $K_1+u_1$ levels of the decision tree after the root, when a number of paths in the decision tree grows beyond a threshold $L_1$, all but the most probable $L_1$ paths are discarded. At step 1208, when level $K_1+u_1$ of the decision tree has been generated, the $u_1$-bit CRC represented in each respective surviving path is used to determine a path of the surviving paths representing a first sequence of $K_1$ decoded bits to include in a decoded vector, and all other paths are discarded.

In step 1210, for a second $K_2+u_2$ levels of the decision tree, when a number of paths in the decision tree grows beyond a threshold $L_2$), all but the most probable $L_2$ paths are discarded. At step 1212, when level $K_1+u_1+K_2+u_2$ of the decision tree has been generated, the $u_2$-bit CRC represented in each respective surviving path is used to determine a path of the surviving paths representing a second sequence of $K_2$ decoded bits to include in the decoded vector, and all other paths are discarded.

In some embodiments, $L_1$ and $L_2$ are equal. In some embodiments, $L_1$ is greater than $L_2$. In some embodiments, $K_1$ is equal to $K_2$.

In some embodiments, where the input vector used for encoding the codeword also included a third sequence of input bits having $K_3$ information bits and a $u_3$-bit CRC, and where the second sequence of input bits occured in the input vector prior to the third sequence of input bits, the decoding method may continue generating the decision tree. For a third $K_3+u_3$ levels of the decision tree, when a number of paths in the decision tree grows beyond a threshold $L_3$, all but the most probable $L_3$ paths are discarded. When level $K_1+u_1+K_2+u_2+K_3+u_3$ of the decision tree has been generated, the $u_3$-bit CRC represented in each respective surviving path is used to determine a path of the surviving paths representing a third sequence of $K_3$ decoded bits to include in the decoded vector.

In some embodiments, $L_1$ is equal to $L_2$ and $L_2$ is greater than $L_3$. In some embodiments, $L_1$ is greater than $L_2$ and $L_2$ is greater than $L_3$.

Some decoder embodiments output the decoded vector once the received word has been fully decoded. Other embodiments output each portion of the decoded vector as soon as each portion has been determined. For example, the first sequence of $K_1$ decoded bits may be output after level $K_1+u_1$ of the decision tree has been generated and the CRC check for that level has been performed. Likewise, the second sequence of $K_2$ decoded bits may be output after level $K_1+u_1+K_2+u_2$ of the decision tree has been generated and the CRC check for that level has been performed.

Figure 13:
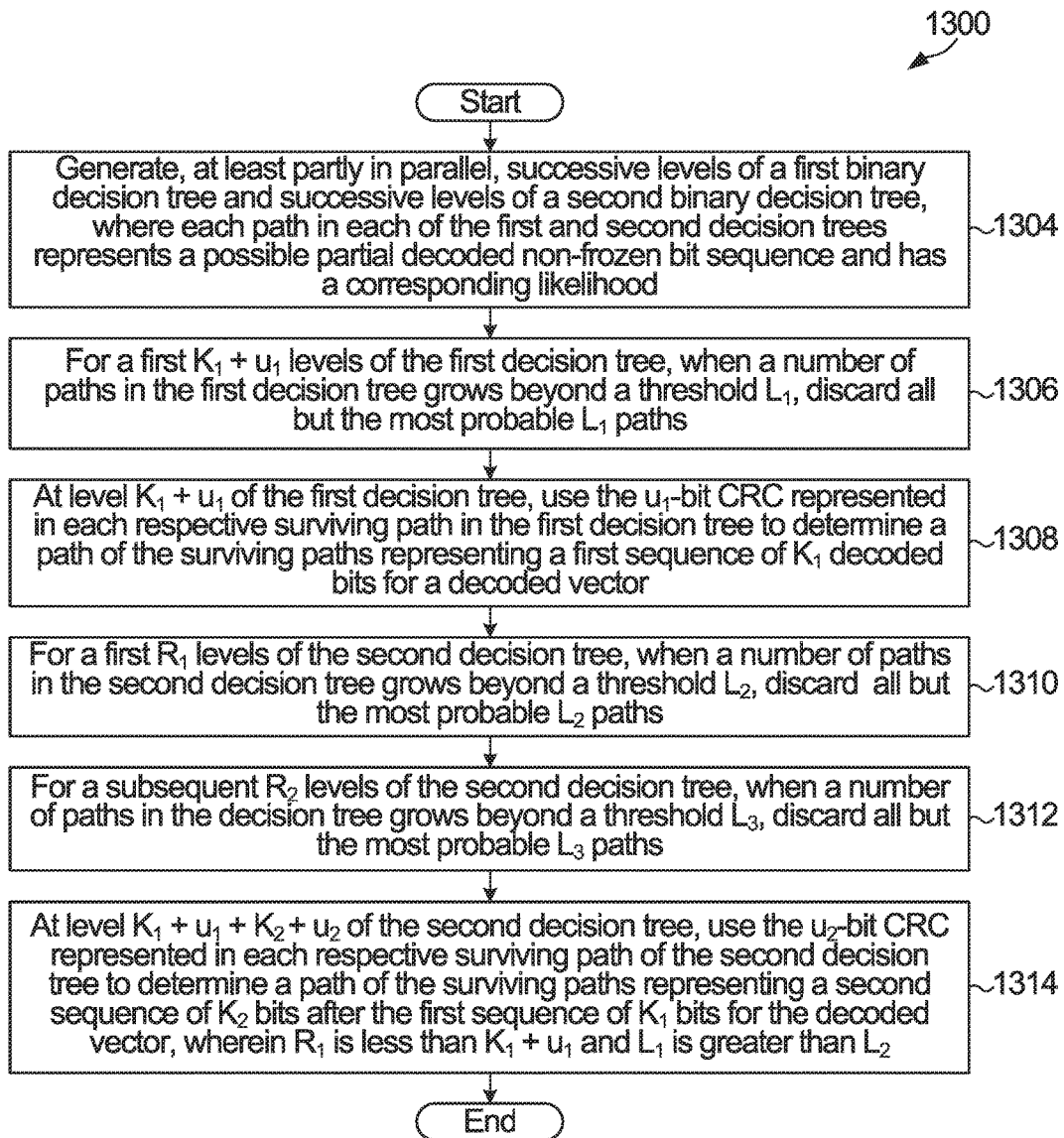
FIG. 13 is a flow diagram of a method for Polar decoding that generates decision trees in parallel.

In some embodiments, some decoding steps are performed in parallel. FIG. 13 is a flow diagram of a method 1300 for Polar decoding that generates decision trees in parallel, potentially reducing the latency required to fully decode a received word compared to the method of FIG. 12B. The illustrated method processes a received word based on a codeword of the same type described with respect to step 1250 in FIG. 12A is received, where CRCs are employed as a particular form of EDC.

At step 1304, the received word is processed by generating first and second binary decision trees. The first and second binary decision trees are generated at least partly in parallel. In particular, at least a portion of the steps 1306 to 1308 and the steps 1310 to 1314 described below are performed in a manner that overlaps at least partly in time.

During generation of the first decision tree, at step 1306, for a first $K_1+u_1$ levels of the first decision tree after the root of the first decision tree, when a number of paths in the first decision tree grows beyond a threshold $L_1$, all but the most probable $L_1$ paths are discarded. At step 1308, when level $K_1+u_1$ of the first decision tree has been generated, the $u_1$-bit CRC represented in each respective surviving path is used to determine a path of the surviving paths representing a first sequence of $K_1$ decoded bits to include in a decoded vector.

During generation of the second decision tree, at step 1310, for a first $R_1$ levels of the second decision tree after the root of the second decision tree, when a number of paths in the second decision tree grows beyond a threshold $L_2$, all but the most probable $L_2$ paths are discarded. At step 1312, for a subsequent $R_2$ levels of the second decision tree, when a number of paths in the decision tree grows beyond a threshold $L_3$, all but the most probable $L_3$ paths are discarded. In some embodiments, at level $K_1+u_1$, the $u_1$-bit CRC represented in each surviving path of the second decision tree is used to discard surviving paths not passing a CRC check with the $u_1$-bit CRC, provided that at least one surviving path passes the CRC check. At step 1314, when level $K_1+u_1+K_2+u_2$ of the second decision tree has been generated, the $u_2$-bit CRC represented in each respective surviving path of the second decision tree is used to determine a path of the surviving paths representing a second sequence of $K_2$ bits to include in the decoded vector after the first sequence of $K_1$ bits.

In the method shown in FIG. 13, $R_1$ is less than $K_1+u_1$ and $L_1$ is greater than $L_2$. Accordingly, for at least an initial portion of the generation of the second decision tree, fewer paths in the second decision tree are retained as survivors than are retained as survivors while generating the first decision tree. This allows the initial levels of the second decision tree to be generated more rapidly than the same levels of the first decision tree.

In some embodiments, $L_2$ is less than $L_3$. That is, the second decision tree generation process can be said to start by retaining fewer survivors at early levels of the second decision tree and then "ramp up" to retaining more survivors at later levels. In some embodiments. $R_2$ is equal to $(K_2+u_2-R_1)$. That is, the "ramp up" occurs for the levels of the second decision tree that represent decisions for the $K_2$ information bits and the $u_2$-bit CRC.

In some embodiments, the "ramp up" is performed in several stages. For example, the process of generating the second decision tree may begin with $L=2$, then transition to $L=4$, then transition to $L=8$. In some embodiments, a Polar decoder generates more than two decision trees in parallel, with the decision trees having differing configurations of "ramp up" stages.

FIGS. 14A to 14D serve to illustrate some ways in which "ramp up" decoding performed in stages may improve the processing latency of a decoder. FIG. 14 is an illustration of a concatenated sequence 1460 of input bits consisting of four sequences of input bits 1450, 1542, 1544, and 1456. The first sequence of input bits 1450 consists of $K_1$ information bits 1402 and a $u_1$-bit CRC 1412 computed based on the $K_1$ information bits 1402. The second sequence of input bits 1452 consists of $K_2$ information bits 1404 and a $u_2$-bit CRC 1414 computed based on the $K_2$ information bits 1404. The third sequence of input bits 1454 consists of $K_3$ information bits 1406 and a $u_3$-bit CRC 1416 computed based on the $K_3$ information bits 1406. The fourth sequence of input bits 1456 consists of $K_4$ information bits 1408 and a $u_4$-bit CRC 1418 computed based on the $K_4$ information bits 1408. The concatenated sequence 1460 may be encoded using a Polar encoding technique, for example as described above with respect to FIG. 8, into a single combined codeword (not shown) for storage or transmission.

Figure 14A:
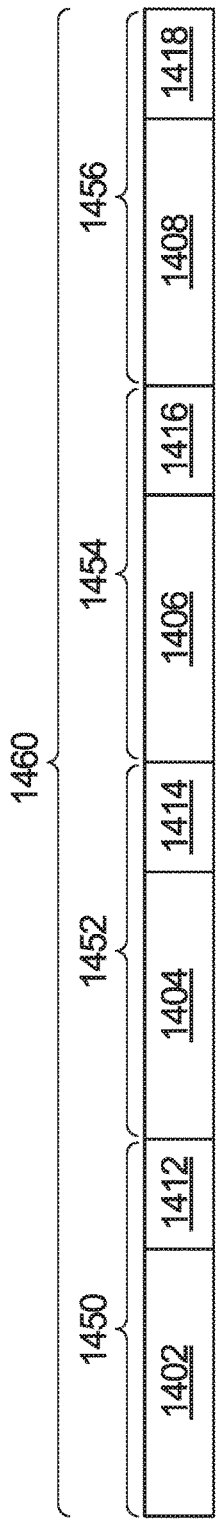
FIG. 14A is an illustration of four sequences of input bits for encoding into a combined codeword.
Figure 14B:
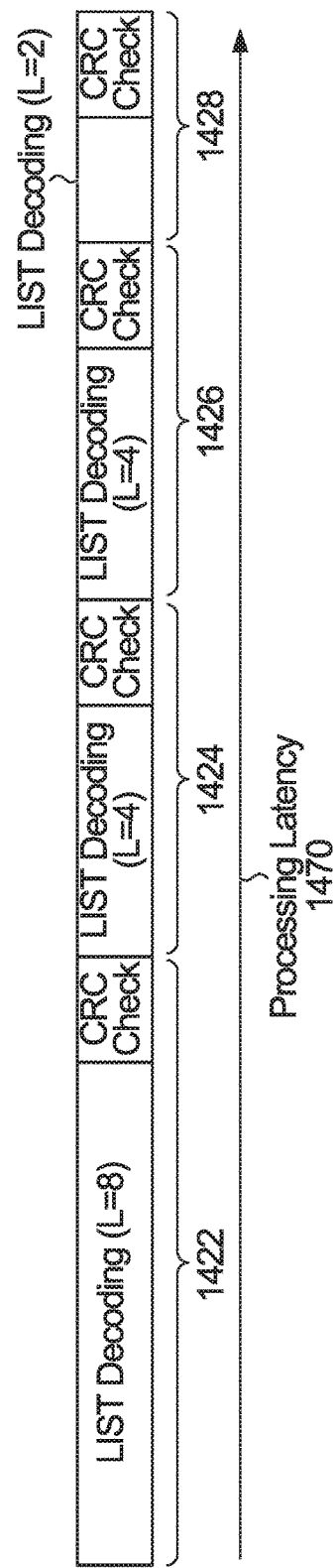
FIG. 14B is an illustration of sequentially decoding a codeword that was encoded based on the sequence of input bits of FIG. 14A.

FIG. 14B illustrates an example of sequentially decoding a codeword that was encoded based on the concatenated sequence of input bits 1460 of FIG. 14A. During the decoding process, a List-type Polar decoding technique, for example as discussed above with respect to FIG. 12, is used. Successive levels of a binary decision tree are generated, each level corresponding to a decision on a respective bit, where each path in the decision tree represents a possible partial decoded non-frozen bit sequence and has a corresponding likelihood.

In a first stage 1422, the $K_1$ information bits 1402 are decoded by generating the binary decision tree with a breadth threshold of $L=8$. That is, for a first $K_1+u_1$ levels of the decision tree after the root, when a number of paths in the decision tree grows beyond a threshold $L=8$, all but the most probable L paths are discarded. When level $K_1+u_1$ of the decision tree has been generated, the $u_1$-bit CRC represented in each respective surviving path is used to determine a path of the surviving paths representing the $K_1$ decoded bits to include in a decoded vector, and all other paths are discarded.

In a subsequent stage 1424, the decoder continues in the same manner to decode the $K_2$ information bits 1404 by generating successive levels of the binary decision tree with a breadth threshold of $L=4$. The decoder then continues on in the same manner in a subsequent stage 1426 to decode the $K_3$ information bits 1406 by generating successive levels of the binary decision tree with a breadth threshold of $L=4$. Finally, the decoder then continues on in the same manner in a subsequent stage 1428 to decode the $K_4$ information bits 1408 by generating successive levels of the binary decision tree with a breadth threshold of $L=2$. In the illustrated example of sequential decoding, the processing latency 1470 for decoding all of the encoded information bits includes the time to perform stages 1422, 1424, 1426, and 1428 in sequence. It should be understood that the specific values of L selected for stages 1422, 1424, 1426, and 1428 are design choices, and that other values may be selected, for example based on desired accuracy and/or latency characteristics for the decoder.

Figure 14C:
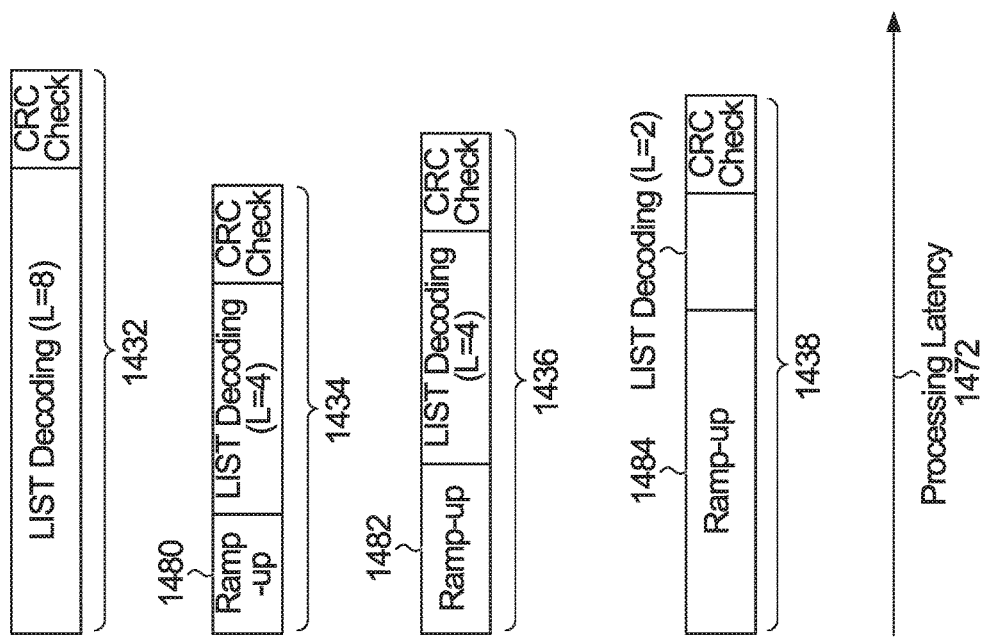
FIG. 14C is an illustration of parallel decoding of a codeword that was encoded based on the sequence of input bits of FIG. 14A.

FIG. 14C is an illustration of decoding, by generating decision trees in parallel, of a codeword that was encoded based on the sequence of input bits of FIG. 14A. During the decoding process, a parallel List-type Polar decoding technique, for example as discussed above with respect to FIG. 13, is used. Successive levels of four binary decision tree are generated in parallel, each level corresponding to a decision on a respective bit, where each path in the decision tree represents a possible partial decoded non-frozen bit sequence and has a corresponding likelihood.

In a first set of operations 1432, the $K_1$ information bits 1402 are decoded by generating a first binary decision tree with a breadth threshold of $L=8$. That is, for a first $K_1+u_1$ levels of the decision tree after the root, when a number of paths in the first decision tree grows beyond a threshold $L=8$, all paths except the most probable L paths are discarded. When level $K_1+u_1$ of the first decision tree has been generated, the $u_1$-bit CRC represented in each respective surviving path is used to determine a path of the surviving paths representing the $K_1$ decoded bits to include in a decoded vector.

In a second set of operations 1434, the $K_1$ information bits 1402 are decoded in a ramp-up stage 1480 by generating a second binary decision tree with a breadth threshold where L is less than 4 for at least a portion of the first $K_1+u_1$ levels of the decision tree after the root. The second binary decision tree generation continues after the $u_1$-bit CRC for the $K_1$ information bits is checked and a surviving path is selected. The $K_2$ information bits 1404 are subsequently decoded with the second decision tree using a breadth threshold of $L=4$. When level $K_1+u_1+K_2+u_2$ of the second decision tree has been generated, the $u_2$-bit CRC represented in each respective surviving path is used to determine a path of the surviving paths representing the $K_2$ decoded bits to include in the decoded vector.

In a third set of operations 1436, the $K_1$ information bits 1402 and the $K_2$ information bits 1404 are decoded in a ramp-up stage 1482 by generating a third binary decision tree with a breadth threshold where L is less than 4 for at least a portion of the first $K_1+u_1+K_2+u_2$ levels of the decision tree after the root. The third binary decision tree generation continues after the $u_2$-bit CRC for the $K_2$ information bits is checked and a surviving path is selected. The $K_3$ information bits 1406 are subsequently decoded with the third decision tree using a breadth threshold of $L=4$. When level $K_1+u_1+K_2+u_2+K_3+u_3$ of the second decision tree has been generated, the $u_3$-bit CRC represented in each respective surviving path is used to determine a path of the surviving paths representing the $K_3$ decoded bits to include in the decoded vector.

In a fourth set of operations 1438, the $K_1$ information bits 1402, the $K_2$ information bits 1404, and the $K_3$ information bits 1406 are decoded in a ramp-up stage 1484 by generating a fourth binary decision tree with a breadth threshold where L is less than 2 for at least a portion of the first $K_1+u_1+K_2+u_2+K_3+u_3$ levels of the decision tree after the root. The fourth binary decision tree generation continues after the $u_3$-bit CRC for the $K_3$ information bits is checked and a surviving path is selected. The $K_4$ information bits 1408 are subsequently decoded with the third decision tree using a breadth threshold of L=2. When level $K_1+u_1+K_2+u_2+K_3+u_3+K_4+u_4$ of the second decision tree has been generated, the $u_4$-bit CRC represented in each respective surviving path is used to determine a path of the surviving paths representing the $K_4$ decoded bits to include in the decoded vector.

In the illustrated example of parallel decoding, the processing latency 1472 for decoding all of the encoded information bits includes the time to perform operations 1432, 1434, 1436, and 1438 in parallel. In the illustrated example, the processing latency 1472 is less than the processing latency 1470 shown in FIG. 14B. It should be understood that the specific values of L selected for operations 1432, 1434, 1436, and 1438 are design choices, and that other values may be selected, for example based on desired accuracy and/or latency characteristics for the decoder. In particular, several values of L may be used during the ramp-up stages 1480, 1482, and 1484. For example, during ramp-up stage 1482, a value of L=1 may initially be used, which transitions at some point during generation of the third decision tree to L=2, and then at a later point during generation. of the third decision tree to L=4.

Figure 14D:
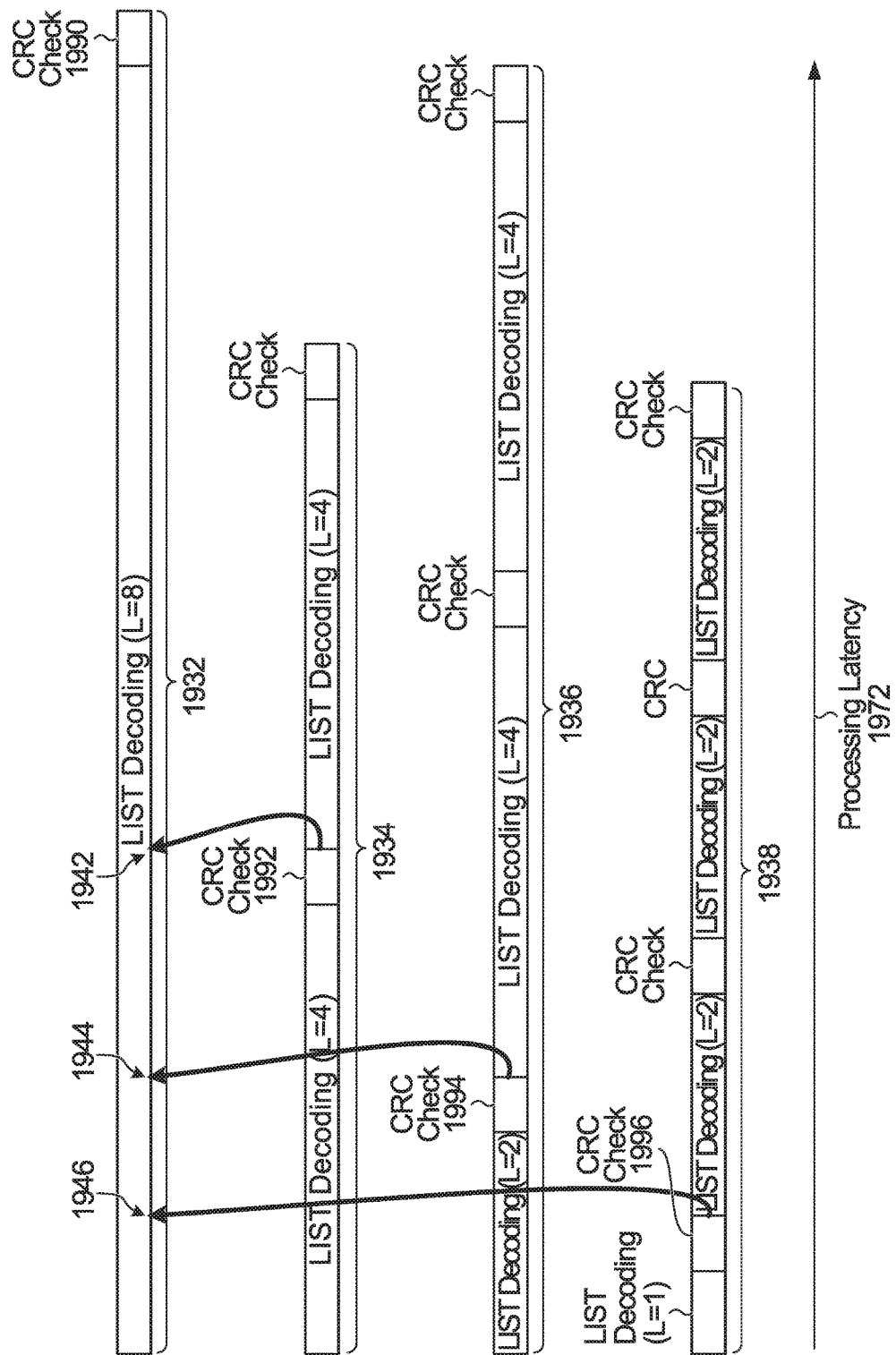
FIG. 14D is an illustration of parallel decoding, with early termination, of a codeword that was encoded based on the sequence of input bits of FIG. 14A.

FIG. 14D illustrates a variation of the parallel decoding technique shown in FIG. 14C in which early termination may be used to potentially improve performance, for example by improving throughout and/or power consumption. A parallel List-type Polar decoding technique is used to decode a codeword that was encoded based on the sequence of input bits of FIG. 14A. During the decoding process, successive levels of four binary decisions trees are generated in parallel by separate threads.

First, second, third, and fourth threads perform a first set of operations 1932, a second set of operations 1934, a third set of operations 1936, and a fourth set of operations 1938, respectively. If early termination is not performed, the sets of operations 1932, 1934, 1936, 1938 proceed as discussed above with respect to operations 1432, 1434, 1436, and 1438, respectively, of FIG. 14C.

However, in some instances, early termination of some threads may be possible. This is because some information bits are decoded by more than one thread, some threads performing List-type decoding for the same information bits at different levels of complexity. For example, in the illustrated example, the first thread attempts to decode the $K_1$ information bits 1402 using a breadth threshold of L=8. Attempts are also made to decode the $K_1$ information bits 1402 by the second thread using L=4, by the third thread using L=2, and by the fourth thread using L=1. A particular thread may be early terminated by one of the higher numbered threads if any one of the higher numbered threads performs a CRC check that indicates that information bits being decoded by the particular thread have been successfully decoded.

For example, if the fourth thread performs the CRC check 1996 and determines that the $K_1$ information bits 1402 have been successfully decoded by the fourth thread, the fourth thread may cause the first thread to be terminated at time 1946. If the third thread performs the CRC check 1994 and determines that the $K_1$ information bits 1402 have been successfully decoded by the third thread, the third thread may cause the first thread to be terminated at time 1944. If the second thread performs the CRC check 1992 and determines that $K_1$ information bits 1402 have been successfully decoded by the second thread, the second thread may cause the first thread to be terminated at time 1942. If no early termination is performed, the decoded bits to include in the decoded vector corresponding to the. $K_1$ information bits 1402 are not determined until CRC check 1990 has been completed by the first thread.

Although specific examples of early termination are shown in FIG. 14D, it should be understood that more generally, any lower numbered thread may be early terminated by any higher numbered thread that passes a CRC check for information bits being decoded by the lower numbered thread with lower cost, for example due to the use of a smaller breadth threshold L. In some cases, early termination may improve overall processing latency 1972 and/or decoding throughput because some threads are terminated early. In some cases, early termination may also reduce the overall average power consumption of the decoding process by reducing the total number of computations necessary for decoding a given codeword.

In some embodiments, certain information bits may be repeated across more than one message being encoded into more than one codeword. In other words, another type of concatenation of information bits involves concatenating information bits across more than one message, thereby resulting in concatenating information bits across more than one codeword. By repeating certain information bits, it may be possible to reduce the error rate when communicating over a channel, improve the performance of a decoder, and/or reduce the complexity of the decoder.

Figure 15:
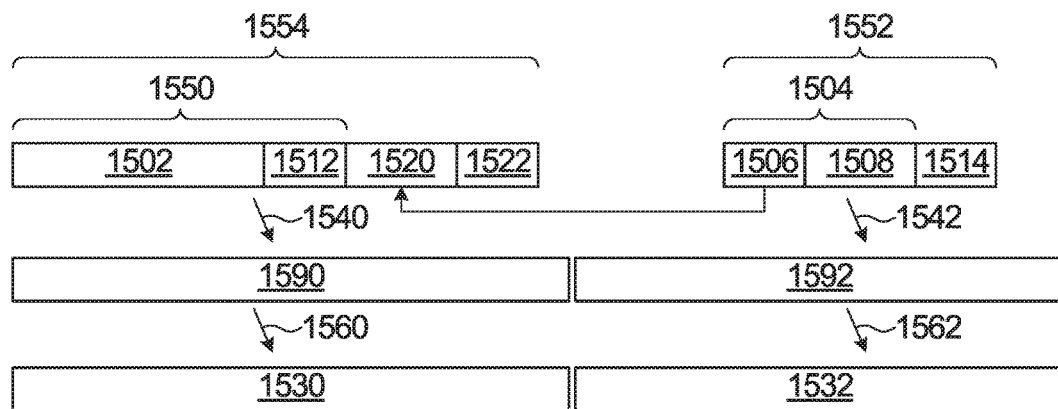
FIG. 15 is an illustration of two sequences of input bits being encoded into two consecutive codewords for transmission, the first sequence including a subset of input bits copied from the second sequence.

FIG. 15 is a specific example of this approach, depicting an illustration of two sequences of input bits 1554, 1552 being encoded into two codewords 1530, 1532 for transmission, the first sequence 1554 including a subset of input bits 1520 from the second sequence 1552. For the purpose of decoding, a received word based on codeword 1532 is decoded after a received word based on codeword 1530. However, the codewords 1530, 1532 may not necessarily be transmitted in succession, and the received words based on the codewords 1530, 1532 may also not necessarily be received in succession in some embodiments, the first codeword 1530 is transmitted prior to transmitting the second codeword 1532. In some embodiments, the first codeword 1530 is transmitted simultaneously with, or otherwise in temporal proximity to, the second codeword 1532.

The first sequence of input bits 1554 comprises an original sequence of input bits 1550, the original sequence consisting of $K_1$ information bits 1502 and a $u_1$-bit CRC 1512 computed based on the $K_1$ information bits 1502. The first sequence of input bits 1554 also comprises copied information bits 1520. The copied information bits 1520 are a duplicate of a subset 1506 of the second sequence of information bits 1504. The copied information bits 1520 consist of $K_2$ information bits. Finally, the first sequence of input bits also comprises a $u_2$-bit CRC 1522 computed based on the $K_2$ information bits.

The second sequence of input bits 1552 consists of $K_2+K_3$ information bits 1504 and a $u_3$-bit CRC 1514 computed based on the $K_2+K_3$ information bits 1504. The $K_2$ leading information bits 1506 of the $K_2+K_3$ information bits 1504 are identical to the copied information bits 1520. $K_3$ information bits 1508 occur after the $K_2$ leading information bits 1506 in the $K_2+K_3$ information bits 1504.

In other words, the leading $K_2$ information bits of the second sequence of input bits 1552 have been copied into the first sequence of input bits 1554. An encoder which copies a subset of information bits to be encoded in a successor codeword to a sequence of information bits to be encoded in a predecessor codeword is referred to herein as a sliding-window Polar encoder. Codes encoded with such an encoder are referred to herein as sliding-window Polar codes.

The first sequence of input bits 1554 is processed by a Polar encoding process to generate a first codeword 1530 of length N. The second sequence of input bits 1552 is processed by a Polar encoding process to generate a second codeword 1532 of length N. The Polar encoding process for the first sequence of input bits 1554 comprises a step 1540 of inserting frozen bits into the first sequence of input bits 1554 to produce a first input vector 1590 of length N, and then multiplying 1560 the first input vector 1590 by a Polar code generator matrix to produce the first codeword 1530. The Polar encoding process for the second sequence of input bits 1552 comprises a step 1542 of inserting frozen bits into the second sequence of input bits 1552 to produce a second input vector 1592 of length N, and then multiplying 1562 the second input vector 1592 by a Polar code generator matrix to produce the second codeword 1532.

In an example embodiment, $K_1$ is equal to $K_2+K_3$ and $u_1$ is equal to $u_3$. In such an embodiment, more information bits are encoded in codeword 1530 than codeword 1532, resulting in a lower coding rate for codeword 1530. To compensate, in some embodiments, a power level at which codeword 1530 is transmitted is higher relative to a baseline power level and/or relative to a power level at which codeword 1532 is transmitted. Because some information bits encoded into codeword 1532 are also encoded in codeword 1530, an error rate for a given SNR for codeword 1532 after a decoding process may be improved, as explained below with respect to FIG. 17. Due to the improved error rate, in some embodiments, a power level at which codeword 1532 is transmitted is lowered relative to a baseline power level and/or relative to a power level at which codeword 1530 is transmitted.

Figure 16:
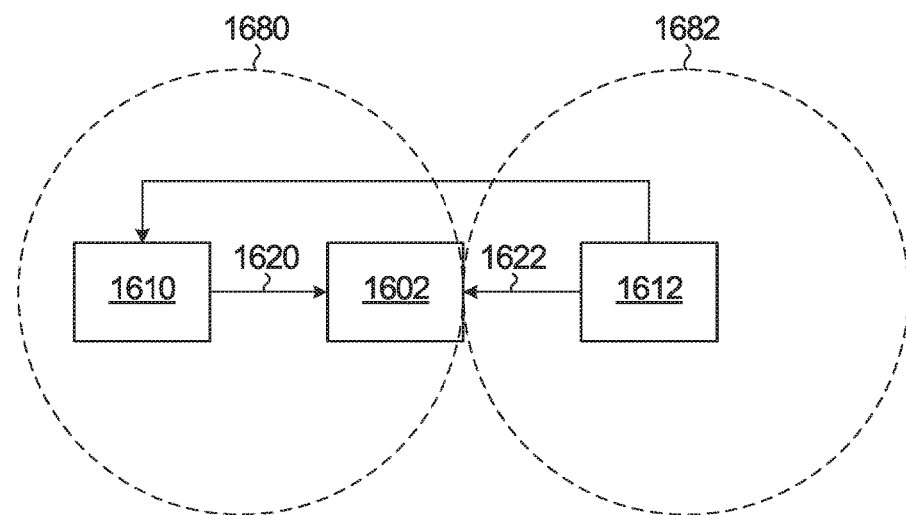
FIG. 16 is a schematic illustration of two base stations in communication with a user equipment (UE) device.

In some embodiments, the first codeword 1530 and the second codeword 1532 are generated by the same apparatus, for example a base station in communication with a user equipment (UE) device. However, the first codeword 1530 and the second codeword 1532 may also be generated by different apparatuses. FIG. 16 is a schematic illustration of a first base station 1610 and a second base station 1612 in communication with a UE device 1602, where the first base station 1610 generates a first codeword and the second base station 1612 generates a second codeword.

In the example use case illustrated in FIG. 16, the UE device 1602 is located within a first cell 1680 and near the boundary of a second cell 1682. The first base station 1610 and the second base station 1612 are coordinating to facilitate handover of the. UE device 1602 to the second cell 1682. The first base station 1610 aims to transmit at least a first sequence of $K_1$ information bits to the UE device 1602 in a first transmission 1620 consisting of the first codeword. The second base station 1612 aims to transmit a second sequence of $K_2+K_3$ information bits to the UE device 1602 in a second transmission 1622 consisting of the second codeword.

The second base station 1612 transmits, over a backhaul connection to the first base station 1610, the leading $K_2$ information bits of the sequence of $K_2+K_3$ information bits. The first base station 1610 then encodes the $K_1$ and $K_2$ information bits into the first codeword in the manner described above with respect to the first codeword 1530 of FIG. 15, and then transmits the first codeword to the UE. The second base station encodes the $K_2+K_3$ information bits into the second codeword in the manner illustrated with respect to the second codeword 1532 of FIG. 15, and then transmits the second codeword to the UE.

Figure 17:
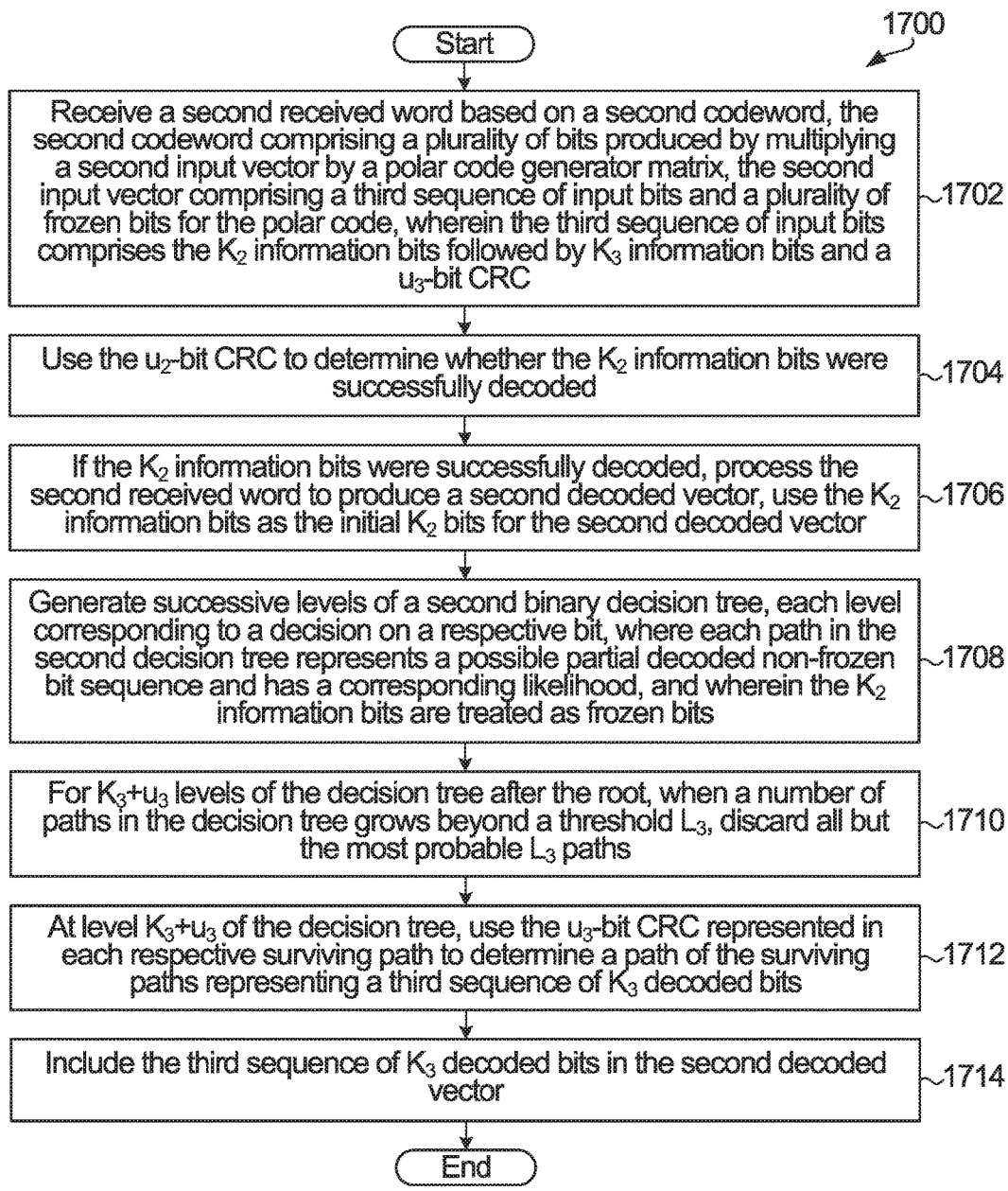
FIG. 17 is a flow diagram of a method for Polar decoding of a second message based on a second codeword encoded with the method illustrated in FIG. 14.

Turning now to decoding, suppose that first and second received words based on first and second sliding-window Polar coded codewords, respectively, are received, where the second codeword is successor of the first codeword. The first received word may be decoded by the methods explained above and illustrated, for example, in FIGS. 12 and 13. FIG. 17 is a flow diagram of a method 1700 for sliding-window Polar decoding of the second received word. For descriptive simplicity, method 1700 will be described according to the premise that method 1700 continues after the method 1202 explained above with respect to FIG. 12B has been performed.

At step 1702, a second received word based on a second codeword is received, the second codeword containing a plurality of bits produced by multiplying a second input vector by a Polar code generator matrix, where the second input vector contained a third sequence of input bits and a plurality of frozen bits for the Polar code. The third sequence of input bits used for producing the second codeword contained the $K_2$ information bits followed by $K_3$ information bits and a $u_3$-bit CRC. The positions of the bits of the $u_3$-bit CRC within the third sequence of input bits and the locations of the frozen bits are known to both the encoder and the decoder.

At step 1704, the $u_2$-bit CRC is used to determine whether the $K_2$ information bits in the first received word were successfully decoded. If the $K_2$ information bits in the first received word were not successfully decoded, then the first received word is discarded and the second received word is decoded with a conventional Polar decoding technique, for example as described in steps 1204, 1206, and 1208 of FIG. 12. At step 1706, if the $K_2$, information bits in the first received word were successfully decoded, then the $K_2$ information bits are included as the initial $K_2$ bits for a second decoded vector.

At step 1708, successive levels of a second binary decision tree are generated, each level corresponding to a decision on a respective bit, where each path in the second decision tree represents a possible partial decoded non-frozen bit sequence and has a corresponding likelihood. During the generation of the second binary decision tree, the $K_2$ information bits are treated as frozen bits.

During the generation of the second binary decision tree, at step 1710, for $K_3+u_3$ levels of the second decision tree after the root, when a number of paths in the decision tree grows beyond a threshold $L_3$, all but the most probable $L_3$ paths are discarded. At step 1712, when level $K_3+u_3$ of the second decision tree has been generated, the $u_3$-bit CRC represented in each respective surviving path is used to determine a path of the surviving paths representing a third sequence of $K_3$ decoded bits, which are then included at step 1714 as the $K_3$ bits after the initial $K_2$ bits in the second decoded vector. All other paths are discarded.

Since the decoding technique for the second received word makes use of information from the first received word, the decoder is referred to herein as a sliding-window Polar decoder.

Because the described sliding-window Polar decoding technique may be able to treat the $K_2$ information hits as frozen bits, and because bit positions further along an input vector tend to correspond to synthetic channels having higher reliability, in some cases a smaller value of $L_3$ may be used in a sliding-window Polar decoder (compared to some Polar decoders that do not make use of information from the first received word) without substantially reducing the decoder's block error rate. In some cases, smaller values of $L_3$ may result in improved decoding latency and/or improved decoding efficiency. In some embodiments, $L_1$ is greater than $L_2$. In some embodiments, $L_1$ is greater than $L_3$. In some embodiments, differing value of least one of $L_1$, $L_2$, and/or $L_3$ may be used in the decoder depending on a power level at which the first codeword was transmitted and/or a power level at which the second codeword was transmitted.

Turning now to example apparatuses for implementing the methods described above, FIG. 18A is a schematic illustration of an apparatus 1800 for encoding and transmitting a codeword. Apparatus 1800 comprises an encoder 1804 coupled to a transmitting device 1806. In the illustrated embodiment, the transmitting device 1806 has an antenna 1808 for transmitting signals over a wireless channel. In some embodiments, the transmitting device 1806 includes a modulator, amplifier, and/or other components of a radio frequency (RF) transmit chain. The encoder 1804 receives input 1802 comprising information bits and is configured to implement a method described above to encode the information bits into a codeword, which is provided to the transmitting device 1806 for transmission via the antenna 1808.

Figure 18A:
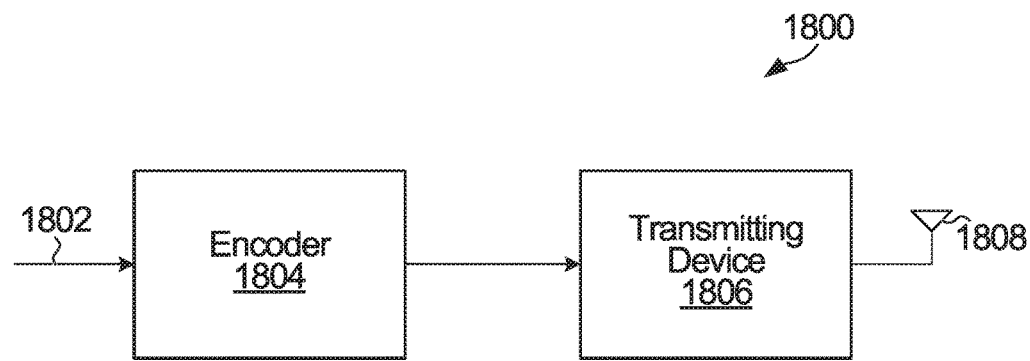
FIG. 18A is a schematic illustration of an apparatus for encoding and transmitting a codeword.
Figure 18B:
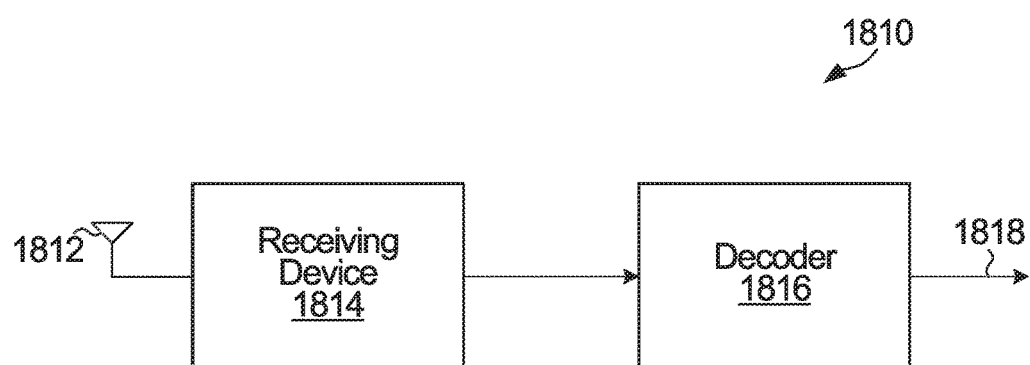
FIG. 18B is a schematic illustration of an apparatus for receiving and decoding a codeword.

FIG. 18B is a schematic illustration of an apparatus 1810 for receiving and decoding a received word. Apparatus 1810 comprises a receiving device 1814 coupled to a decoder 1416. In the illustrated embodiment, the receiving device 1814 has an antenna 1812 for receiving signals from a wireless channel. In some embodiments, the receiving device 1814 includes a demodulator, amplifier, and/or other components of a radio frequency (RF) receive chain. The receiving device 1814 receives a signal carrying a received word based on a codeword via the antenna 1812. The received word is provided to the decoder 1816. The decoder 1816 is configured to implement a method described above to decode the received word into an output vector consisting of information bits, which is provided as output 1818 from the decoder.

In some embodiments, a non-transitory computer readable medium comprising instructions for execution by a processor may be provided to control the operation of encoder 1804 in FIG. 18A or decoder 1816 in FIG. 18B, and/or to otherwise control the execution of methods described above. In some embodiments, the processor being controlled may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which can be, for example, a compact disc read-only memory (CD-ROM), universal serial bus (USB) flash disk, or a removable hard disk.

The previous description of some embodiments is provided to enable any person skilled in the art to make or use an apparatus, method, or processor readable medium according to the present disclosure. Various modifications to these embodiments will be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

What is claimed is:

1. A method for encoding and transmitting a first codeword comprising: with an encoder,
    processing $K_1$ information bits to produce a $u_1$-bit error-detecting code (EDC), wherein the $K_1$ information bits are information bits of a first message;
    processing $K_2$ information bits to produce a $u_2$-bit EDC, wherein the $K_2$ information bits are leading information bits of a second message;
    producing an input vector for polar encoding, the input vector including a first sequence of input bits, a second sequence of input bits, and a plurality of frozen bits, wherein
    the first sequence of input bits comprises the $k_1$ information bits and the $u_2$-bit EDC, the second sequence of input bits comprises the $1<2$ information bits and the $u_2$-bit EDC,
    Polar encoding the input vector to produce the first codeword; and
    Polar encoding the second message to produce a second codeword;
    with a transmitting device, transmitting, at a first power, the first codeword over a physical channel, the polar encoding being performed to improve a reliability of transmission of the input bits over the physical channel;
    with the transmitting device, transmitting, at a second power level, the second codeword,
    wherein the first power level is higher than the second power level.

2. The method of claim 1, wherein Polar encoding comprises multiplying the input vector by a generator matrix for a Polar code and wherein the generator matrix is an m-fold Kronecker product matrix $G_2^{\otimes m}$, where $$G_2 = \begin{bmatrix} 1 & 0 \\ 1 & 1 \end{bmatrix} \text{ or } G_2 = \begin{bmatrix} 1 & 1 \\ 0 & 1 \end{bmatrix}.$$

3. The method of claim 1, wherein the $u_1$-bit EDC and the $u_2$-bit EDC are cyclic redundancy codes (CRC).

4. The method of claim 1, further comprising:
    with the encoder, processing a sequence of $K_3$ information bits to produce a $u_3$-bit EDC,
    wherein the produced input vector further comprises a third sequence of input bits, and the third sequence of input bits comprises the sequence of $K_3$ information bits and the $u_3$-bit EDC.

5. The method of claim 1, wherein the second message contains K3 information bits after the K2 information bits, and a u3-bit EDC generated from the K2 and the K3 information bits in combination.

6. The method of claim 1, further comprising with the transmitting device, transmitting the first codeword prior to transmitting the second codeword.

7. The method of claim 1, further comprising with the transmitting device, transmitting the first codeword in temporal proximity to transmitting the second codeword.

8. The method of claim 1, wherein the method is performed by a base station and wherein the first codeword is transmitted to a user equipment.

9. The method of claim 1 further comprising with the encoder, placing at least one of the $u_1$-bit EDC or $u_2$-bit EDCs is placed in bit positions of the input vector that satisfy a desired reliability criteria.

10. The method of claim 1 further comprising:
placing the $u_1$-bit EDC and $K_1$ information bits in bit positions of a first group of bit positions of the input vector and
placing the $u_2$-bit EDC and $K_2$ information bits in bit positions of a second group of bit positions of the input vector,
wherein at least one of the $u_1$-bit EDC and $u_2$-bit EDC is placed in bit positions that satisfy a reliability criterion.

11. The method of claim 10 wherein the $u_1$-bit EDC is placed in bit positions in the first group with a highest reliability and the $K_1$ information bits are placed with a highest remaining reliability in the first group and wherein the $u_2$-bit EDC is placed in bit positions of the second group with a highest reliability and the $K_2$ information bits are placed in bit positions with a highest remaining reliability in the second group.

12. An apparatus comprising:
an encoder configured to produce a first codeword by:
processing $K_1$ information bits to produce a $u_1$ bit error-detecting, code (EDC), wherein the $K_1$ information bits are information bits of a first message;
processing $K_2$ information bits to produce a $u_2$-bit EDC, wherein the $K_2$ information bits are leading information bits of a second message;
producing an input vector for polar encoding, the input vector including comprising a first sequence of input bits, a. second sequence of input bits, and a plurality of frozen bits, wherein
the first sequence of input bits comprises the $K_1$ information bits and the ui-bit EDC,
the second sequence of input bits comprises the $K_2$ information bits and the $u_2$-bit EDC, and
Polar encoding the input vector to produce the first codeword;
Polar encoding, the second message to produce a second codeword; and
a transmitting device for transmitting, at a first power, the first codeword over a physical channel, the polar encoding being performed to improve a reliability of transmission of the input bits over the physical channel, and for transmitting, at a second power level, the second codeword, wherein the first power level is higher than the second power level.

13. The apparatus of claim 12, wherein the encoder is further configured to Polar encode by multiplying the input vector by a generator matrix for a Polar code, wherein the generator matrix is an m-fold Kronecker product matrix $G_2^{\otimes m}$, where $$G_2 = \begin{bmatrix} 1 & 0 \\ 1 & 1 \end{bmatrix} \text{ or } G_2 = \begin{bmatrix} 1 & 1 \\ 0 & 1 \end{bmatrix}.$$

14. The apparatus of claim 12, wherein the $u_1$-bit EDC and the $u_2$-bit EDC are cyclic redundancy codes (CRC).

15. The apparatus of claim 12 wherein the encoder is further configured to:
process a sequence of $K_3$ information bits to produce a $u_3$-bit EDC,
wherein the produced input vector further comprises a third sequence of input bits, and the third sequence of input bits comprises the sequence of $K_3$ information bits and the $u_3$-bit EDC.

16. The apparatus of claim 12, wherein the second message contains K3 information bits after the K2 information bits, and a u3-bit EDC generated from the K2 and the K3 information bits in combination.

17. The apparatus of claim 12, wherein the transmitting device is further configured to transmit the first codeword prior to transmitting the second codeword.

18. The apparatus of claim 12, wherein the transmitting device is further configured to transmit the first codeword in temporal proximity to transmitting the second codeword.

19. The apparatus of claim 12 wherein the apparatus is implemented in a base station and wherein the transmitting device is configured to transmit the first codeword to a User Equipment (UE) device.

\* \* \* \* \*